US011961464B2

(12) United States Patent
Wei et al.

(10) Patent No.: US 11,961,464 B2
(45) Date of Patent: Apr. 16, 2024

(54) DISPLAY PANEL AND DISPLAY APPARATUS

(71) Applicant: WUHAN TIANMA MICRO-ELECTRONICS CO., LTD., Wuhan (CN)

(72) Inventors: Qian Wei, Wuhan (CN); Shanglong Wang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/305,480

(22) Filed: Apr. 24, 2023

(65) Prior Publication Data

US 2023/0267877 A1 Aug. 24, 2023

(30) Foreign Application Priority Data

Jan. 3, 2023 (CN) ........................ 202310003671.2

(51) Int. Cl.
*G09G 3/32* (2016.01)

(52) U.S. Cl.
CPC ....... *G09G 3/32* (2013.01); *G09G 2300/0842* (2013.01); *G09G 2310/0275* (2013.01); *G09G 2320/0209* (2013.01); *G09G 2320/0233* (2013.01)

(58) Field of Classification Search
CPC ......... G09G 3/3233; G09G 2300/0426; G09G 2300/0819; G09G 2320/0233; G09G 2320/0209; G09G 2320/0214; H10K 59/12; H10K 59/10; H10K 59/1201; H10K 59/121; H10K 59/131; H10K 59/126; G02B 2207/121; H05K 9/00–0098
See application file for complete search history.

(56) References Cited

U.S. PATENT DOCUMENTS 10,923,549 B2 * 2/2021 Lee .................... H10K 59/1216
2018/0040278 A1 * 2/2018 Chu .................... H10K 59/126

* cited by examiner

*Primary Examiner* — Koosha Sharifi-Tafreshi
(74) *Attorney, Agent, or Firm* — CHRISTENSEN O'CONNOR JOHNSON KINDNESS PLLC

(57) ABSTRACT

A display panel and a display apparatus are provided. The display panel is connected to a data driver that outputs first and second data signals sequentially through an output terminal. First and second data lines are configured to receive the first and second data signals, respectively. First and second sub-pixels are connected to the first and second data lines, respectively. A first signal line crosses the first and second data lines to form overlapping portions. A gating circuit connects the output terminal to the first and second data lines. A shielding pattern overlaps with at least one overlapping portion. The shielding pattern is configured to receive a fixed potential when the output terminal of the data driver provides a data signal to the data line through the gating circuit.

17 Claims, 14 Drawing Sheets

DISPLAY PANEL AND DISPLAY APPARATUS

CROSS-REFERENCE TO RELATED DISCLOSURE

The present disclosure claims priority to Chinese Patent Disclosure No. 202310003671.2, filed on Jan. 3, 2023, the content of which is incorporated herein by reference in its entirety.

TECHNICAL FIELD

The present disclosure relates to the field of display technologies, and, particularly relates to a display panel and a display apparatus.

BACKGROUND

A display panel includes multiple sub-pixels and multiple signal lines. The signal line is connected to the sub-pixel to drive the sub-pixel. In the display panel, a large number of horizontal signal lines and a large number of vertical signal lines cross each other, and coupling capacitances are formed at positions where the horizontal lines and the vertical signal lines cross, which will affect the display effect. In the related art, a display crosstalk between the horizontal dark strips and the horizontal bright strips occurs, thereby affecting the display effect.

SUMMARY

A first aspect of the present disclosure provides a display panel. The display panel is connected to a data driver configured to output at least one first data signal and at least one second data signal sequentially through an output terminal. The display panel includes data lines each extending in a first direction, sub-pixels including at least one first sub-pixel and at least one second sub-pixel, first signal lines each extending along a second direction, a gating circuit, a substrate, a first metal layer, a second metal layer, and a third metal layer. The data lines include at least one first data line and at least one second data line, each of the at least one first data line is configured to receive one of the at least one first data signal, and each of the at least one second data line is configured to receive one of the at least one second data signal. One of the at least one first sub-pixel is connected to one of the at least one first data line, and one of the at least one second sub-pixel is connected to one of the at least one second data line. One of the first signal lines crosses one of the at least one first data line to form a first overlapping portion, and crosses one of the at least one second data line to form a second overlapping portion, the second direction intersecting the first direction. The gating circuit is configured to connect the output terminal of the data driver to the at least one first data line and the at least one second data line through switch units. The first metal layer is disposed on the substrate and includes the first signal lines. The second metal layer is disposed on the substrate and includes the at least one first data line and the at least one second data line. The third metal layer is disposed between the first metal layer and the second metal layer, and includes a shielding layer. The shielding layer includes a shielding pattern that overlapping with at least one of the first overlapping portion or the second overlapping portion. The shielding pattern is configured to receive a fixed potential when the output terminal of the data driver provides a data signal to the data lines through the gating circuit.

A second aspect of the present disclosure provides a display apparatus including a display panel. The display panel is connected to a data driver configured to output at least one first data signal and at least one second data signal sequentially through an output terminal. The display panel includes data lines each extending in a first direction, sub-pixels including at least one first sub-pixel and at least one second sub-pixel, first signal lines each extending along a second direction, a gating circuit, a substrate, a first metal layer, a second metal layer, and a third metal layer. The data lines include at least one first data line and at least one second data line, each of the at least one first data line is supplied with one of the at least one first data signal, and each of the at least one second data line is supplied with one of the at least one second data signal. One of the at least one first sub-pixel is connected to one of the at least one first data line, and one of the at least one second sub-pixel is connected to one of the at least one second data line. One of the first signal lines crosses one of the at least one first data line to form a first overlapping portion, and crosses one of the at least one second data line to form a second overlapping portion, the second direction intersecting the first direction. The gating circuit is configured to connect the output terminal of the data driver to the at least one first data line and the at least one second data line through switch units. The first metal layer is disposed on the substrate and includes the first signal lines. The second metal layer is disposed on the substrate and includes the at least one first data line and the at least one second data line. The third metal layer is disposed between the first metal layer and the second metal layer, and includes a shielding layer. The shielding layer includes a shielding pattern that overlapping with at least one of the first overlapping portion or the second overlapping portion. The shielding pattern is supplied with a fixed potential when the output terminal of the data driver provides a data signal to the data lines through the gating circuit.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to more clearly illustrate objectives, technical solutions, and advantages of the embodiments of the present disclosure, the technical solutions in the embodiments of the present disclosure are clearly and completely described in details with reference to the accompanying drawings. Obviously, the described embodiments are merely some of the embodiments of the present disclosure rather than all of the embodiments. All other embodiments obtained by those skilled in the art based on the embodiments of the present disclosure shall fall within the scope of the present disclosure.

The terms used in the embodiments of the present disclosure are merely for the purpose of describing specific embodiment, rather than limiting the present disclosure. The terms “a”, “an”, “the” and “said” in a singular form in an embodiment of the present disclosure and the attached claims are also intended to include plural forms thereof, unless noted otherwise.

Figure 1:
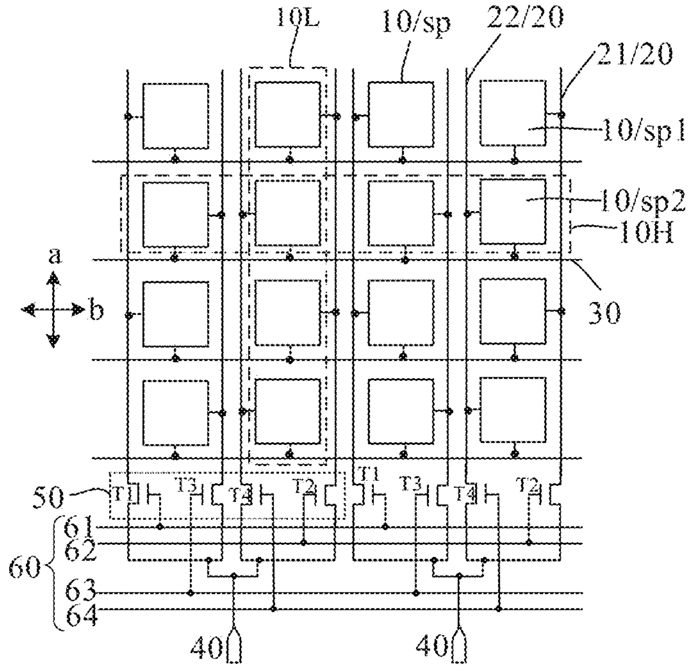
FIG. 1 is a schematic diagram of a display panel according to an embodiment of the present disclosure.

FIG. 1 is a schematic diagram of a display panel according to an embodiment of the present disclosure. As shown in FIG. 1, the display panel includes multiple sub-pixels sp. The sub-pixel includes a light-emitting device (not shown in FIG. 1) and a pixel circuit 10. FIG. 1 only schematically shows the pixel circuit 10 with a block diagram, and the structure of the pixel circuit 10 will be described in the following embodiments. Multiple pixel circuits 10 are arranged in a first direction a to form a pixel circuit column 10L, multiple pixel circuits 10 are arranged in in a second direction b to form a pixel circuit row 10H, and the first direction a and the second direction b intersect with each other. The display panel includes data lines 20 each extending along the first direction a and horizontal signal lines 30 each extending along the second direction b. Multiple pixel circuits 10 arranged in the first direction a in a pixel circuit column 10L are connected to each other by a data line 20. Multiple pixel circuits 10 arranged in the second direction b in the pixel circuit row 10H are connected to each other by a horizontal signal line 30. The horizontal signal line 30 at least includes a row gating line (also known as a scan line). When displaying an image, multiple row gating lines arranged in the first direction a output gating signals sequentially to control the pixel circuit row 10H row by row. The data lines 20 include a first data line 21 and a second data line 22. The sub-pixels sp include a first sub-pixel sp1 and a second sub-pixel sp2. The first sub-pixel sp1 is connected to the first data line 21. The second sub-pixel sp2 is connected to the second data line 22.

In some embodiments of the present disclosure, one pixel circuit column 10L corresponds to two data lines 20. The first data line 21 and the second data line 22 that are connected to a same pixel circuit column 10L form a line group. For one pixel circuit column 10L, the pixel circuits 10 in the first sub-pixels sp1 and the pixel circuits 10 in the second sub-pixels sp2 are alternately arranged in the first direction a. That is, one of the first data line 21 and the second data line 22 is connected to an odd-numbered pixel circuit 10 in the pixel circuit column 10L, and the other one of the first data line 21 and the second data line 22 is connected to an even-numbered pixel circuit 10 in the pixel circuit column 10L. In other words, multiple pixel circuits in one pixel circuit column 10L are electrically connected to the first data line 21 and the second data line 22 alternately.

The display panel is connected to a data driver (the data driver is not shown in FIG. 1), and an output terminal of the data driver is connected to a signal terminal 40 on the display panel. The data driver outputs a first data signal and a second data signal sequentially through the output terminal, then the signal terminal connected to the output terminal correspondingly outputs the first data signal and the second data signal sequentially. The first data line 21 is supplied with the first data signal, and the second data line 22 is supplied with the second data signal. In other words, the output terminal provides data signals sequentially to the first data line 21 and the second data line 22.

The display panel includes a gating circuit 50 and power lines 60. The power lines 60 are configured to control the gating circuit 50. The gating circuit 50 is configured to connect the output terminal of the data driver to the first data line 21 and the second data line 22 by using multiple switch units. One gating circuit 50 is connected to at least two first data lines 21 and at least two second data lines 22.

In the display panel provided by the embodiments of the present disclosure, one pixel circuit column 10L corresponds to one first data line 21 and one second data line 22; and the first data line 21 and the second data line 22 are connected to the odd-numbered pixel circuit 10 and the even-numbered pixel circuit 10 in the pixel circuit column 10L, respectively. The gating circuit 50 is provided and is configured to connect the output terminal of the data driver to the first data line 21 and the second data line 22. The configuration of the gating circuit of 50 can reduce the number of output terminal of the data driver, saving production cost of the data driver.

In FIG. 1, one gating circuit 50 is connected to two first data lines 21 and two second data lines 22. The first data line 21 is connected to the odd-numbered pixel circuit 10 in the pixel circuit column 10L, and the second data line 22 is connected to the even-numbered pixel circuit 10 in the pixel circuit column 10L. The gating control lines 60 include a first control line 61, a second control line 62, a third control line 63, and a fourth control line 64. The switch units in the gating circuit 50 include a first switch unit T1, a second switch unit T2, a third switch unit T3, and a fourth switch unit T4. In FIG. 1, in the first direction a, the pixel circuit rows 10H arranged from top to bottom include a first pixel circuit row, a second pixel circuit row, a third pixel circuit row, and a fourth pixel circuit row. In the second direction b, the pixel circuit columns 10L arranged from left to right include a first pixel circuit column, a second pixel circuit column, a third pixel circuit column, and a fourth pixel circuit column. The pixel circuits in four rows and four columns are shown in FIG. 1. For example, the pixel circuit in a $1^{st}$ row and $1^{st}$ column is denoted as (1, 1).

When driving the first pixel circuit row, the first control line 61 provides an enabling signal to control the first switch unit T1 in the control gating circuit 50 to be turned on, and the signal terminal 40 is electrically connected to one first data line 21 so as to provide a data signal to the first data line 21. The data signal provided by a left signal terminal 40 is supplied to the pixel circuit (1, 1). The data signal provided by a right signal terminal 40 is supplied to the pixel circuit (1, 3). Then, the second control line 62 provides an enabling signal to control the second switch unit T2 in the control gating circuit 50 to be turned on, and the signal terminal 40 is electrically connected to the other first data line 21 so as to provide a data signal to the other first data line 21. The data signal provided by the left signal terminal 40 is supplied to the pixel circuit (1, 2). The data signal provided by the right signal terminal 40 is supplied to the pixel circuit (1, 4). The first control line 61 and the second control line 62 each provide an enabling signal once to drive the first pixel circuit row.

When driving the second pixel circuit row, the third control line 63 provides an enabling signal to control the third switch unit T3 in the control gating circuit 50 to be turned on, and the signal terminal 40 is electrically connected to one second data line 22 so as to provide a data signal to the second data line 22. The data signal provided by the left signal terminal 40 is supplied to the pixel circuit (2, 1). The data signal provided by the right signal terminal 40 is supplied to the pixel circuit (2, 3). Then, the fourth control line 64 provides an enabling signal to control the fourth switch unit T4 in the control gating circuit 50 to be turned on, and the signal terminal 40 is electrically connected to the other second data line 22 so as to provide a data signal to the other second data line 22. The data signal provided by the left signal terminal 40 is supplied to the pixel circuit (2, 2). The data signal provided by the right signal terminal 40 is supplied to the pixel circuit (2, 4). The third control line 63 and the fourth control line 64 each provide an enabling signal once to drive of the first pixel circuit row.

When driving the first pixel circuit row and the second pixel circuit row adjacent to each other, the data driver outputs two first data signals and two second data signals sequentially through one output terminal. When driving the first pixel circuit row and the second pixel circuit row continuously, two pixel circuits 10 in a same pixel circuit column 10L are driven by the first data line 21 and the second data line 22, respectively. In other words, two data lines 20 drive two adjacent pixel circuits 10 in a same pixel circuit column 10L, respectively.

In a solution where no gating circuit is provided, the data driver provides output terminals corresponding to all data lines. During the time where one pixel circuit row is driven, multiple output terminals of the data driver provide data signals simultaneously. In a solution where the gating circuit is provided, when a pixel circuit column corresponds to a data line, during a period where one pixel circuit row is driven, one output terminal of the data driver provides at least two data signals in a time-division manner, so that the charging time of each data line is shortened, thereby leading to insufficient charging, resulting in distortion of display image.

In some embodiments of the present disclosure, a gating circuit 50 is provided and is configured to connect the output terminal of the data driver to the first data lines 21 and the second data lines 22. The pixel circuits 10 in the pixel circuit column 10L are alternately connected to the first data line 21 and the second data line 22. That is, the first data line 21 and the second data line 22 alternately drive the pixel circuits 10 in the same pixel circuit column 10L. Compared with a solution in which one data line continuously drives the adjacent pixel circuits 10 in the same pixel circuit column 10L, the embodiments of the present disclosure can ensure sufficient charging time of each data line 20, and avoid the image distortion caused by insufficient charging of the data line.

In a solution in the related art, one data line corresponds to one pixel circuit column. In the period where one pixel circuit row is driven, the output terminal of the data driver provides a data signal once, and a voltage on the data line jumps once. In some embodiments of the present disclosure, taking the embodiment of FIG. 1 as an example, in the period where one pixel circuit row 10H is driven, the output terminal of the data driver provides a data signal twice, that is, the data signal jumps twice. However, there is a coupling effect between the data line 20 and the horizontal signal line 30, the voltage jump on data line 20 will cause the voltage jump on the horizontal signal line 30, while the voltage jump on the horizontal signal line 30 will in turn affect the voltage on the data line 20. That is, compared with the solution in the related art, in the embodiments of the present disclosure, the coupling effect between the data line and the horizontal signal line will be more apparent, which affects the display.

In other words, in the embodiments of the present disclosure, two data lines 20 drive one pixel circuit column 10L to result in an increase in the number of data line 20, so that a large overlapping area between the data line 20 and the horizontal signal line 30 increases, and the coupling capacitance between the data line 20 and the horizontal signal line 30 increases, which affects the display. When the pixel at a local position switch from a gray scale to black, due to the coupling effect between the data line 20 and the horizontal signal line 30, the voltage jump on the data line 20 will cause the voltage jump on the horizontal signal line 30, resulting in the voltage fluctuation on the horizontal signal line 30. However, the voltage fluctuation on the horizontal signal line 30 will in turn affect the data line 20 connected to the sub-pixel not displaying black, thereby resulting in voltage fluctuation on this data line 20. As a result, a display crosstalk between the horizontal dark strips and the horizontal bright strips occurs at the upper and lower boundaries of the region display black, thereby affecting the display effect.

In order to solve the display crosstalk between the horizontal dark strips and the horizontal bright strips, the embodiments of the present disclosure provide a display panel including a shielding layer. A shielding pattern in the shielding layer overlaps with an overlapping portion formed by crossing the data line and the horizontal signal line. The shielding pattern is used to form a shielding effect between the data line and the horizontal signal line so as to reduce the coupling effect between the data line and the horizontal signal line, improving the crosstalk between the horizontal dark strips and the horizontal bright strips.

Figure 2:
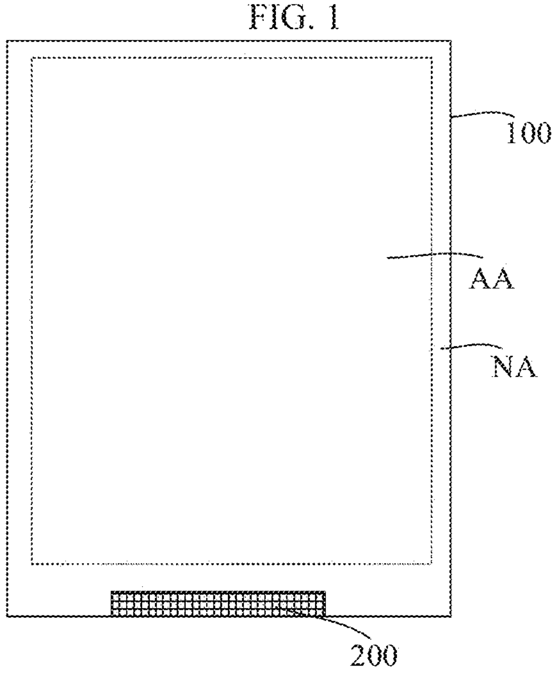
FIG. 2 is a schematic diagram of a display module according to an embodiment of the present disclosure.

FIG. 2 is a schematic diagram of a display module according to an embodiment of the present disclosure. In some embodiments, as shown in FIG. 2, the display module includes a display panel 100 and a data driver 200. The display panel 100 has a display region AA and a non-display region NA. The data driver 200 is bound in the non-display region NA of the display panel 100. The data driver 200 can be a display drive chip. The data driver 200 is configured to provide a data signal to the data line 20 in the display panel 100 through an output terminal. In another embodiment, the data driver 200 is fixed on a flexible circuit board. The flexible circuit board is used to electrically connect the data driver 200 and the display panel 100.

Figure 3:
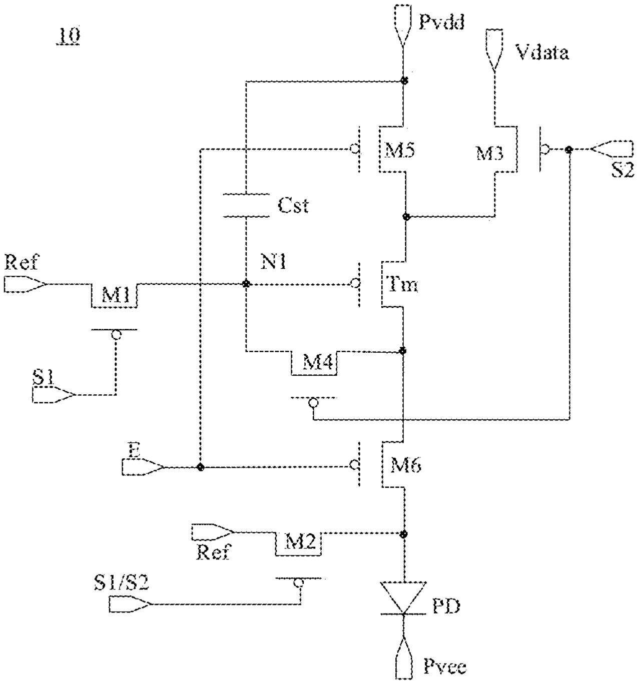
FIG. 3 is a schematic diagram of a pixel circuit according to an embodiment of the present disclosure.

FIG. 3 is a schematic diagram of a pixel circuit according to an embodiment of the present disclosure. As shown in FIG. 3, a pixel circuit 10 includes a driving transistor Tm, a gate reset transistor M1, an electrode reset transistor M2, a data writing transistor M3, a threshold compensation transistor M4, a first light-emitting control transistor M5, a second light-emitting control transistor M6, and a storage capacitor Cst. A first electrode of the gate reset transistor M1 receives a reset signal Ref, a second electrode of the gate reset transistor M1 is coupled with a gate of the driving transistor Tm, and a gate of the gate reset transistor M1 receives a first scan signal S1. A first electrode of the data writing transistor M3 receives a data signal Vdata, a second electrode of the data writing transistor M3 is coupled with the first electrode of the driving transistor Tm, the threshold compensation transistor M4 is connected in series between the gate and the second electrode of the driving transistor Tm, and the gate of the data writing transistor M3 and the gate of the threshold compensation transistor M4 each receive a second scan signal S2. The driving transistor Tm is connected in series between the first light-emitting control transistor M5 and the second light-emitting control transistor M6. A gate of the first light-emitting control transistor M5 and a gate of the second light-emitting control transistor M6 each receive a light-emitting control signal E. A first electrode plate of the storage capacitor Cst and a first electrode of the first light-emitting control transistor M5 receive a positive power signal Pvdd, a second electrode of the second light-emitting control transistor M6 is coupled with a first electrode of the light-emitting device PD, and a second electrode of the light-emitting device PD receives a negative power signal Pvee. The first electrode of the electrode reset transistor M2 receives a reset signal Ref, the second electrode of the electrode reset transistor M2 is coupled with the first electrode of the light-emitting device PD, the gate of the electrode reset transistor M2 receives a first scan signal S1, or a gate of the electrode reset transistor M2 receives a second scan signal S2. That is, the gate of the electrode reset transistor M2 receives the same signal as the gate of the gate reset transistor M1, or the gate of the electrode reset transistor M2 receives the same signal as the gate of the data writing transistor M3. The light-emitting device PD is an organic light-emitting diode or an inorganic light-emitting diode.

FIG. 3 schematically shows that all transistors in the pixel circuit are p-type transistors. In some embodiments, at least one of the transistors in the pixel circuit are N-type transistors, which are not shown in the drawing.

FIG. 3 schematically shows that the first electrode of the electrode reset transistor M2 and the first electrode of the gate reset transistor M1 each receive the reset signal Ref. That is, the first electrode of the electrode reset transistor M2 and the first electrode of the gate reset transistor M1 receive a same reset signal. In some embodiments, the first electrode of the gate reset transistor M1 receives a first reset signal, and the first electrode of the electrode reset transistor M2 receives a second reset signal. The first reset signal and the second reset signal have different voltage values.

The operation of the pixel circuit at least includes a gate reset stage, a data writing stage, and a light-emitting stage. During the gate reset stage, the gate reset transistor M1 is turned on to reset the gate of the driving transistor Tm; during the data writing stage, the data writing transistor M3 and the threshold compensation transistor M4 are turned on to write the data voltage to the gate of the driving transistor Tm; and during the light-emitting phase, the first light-emitting control transistor M5 and the second light-emitting control transistor M6 are turned on, and the driving transistor Tm generates a drive current under the control of its gate potential, and provides the drive current to the light-emitting device PD.

Figure 4:
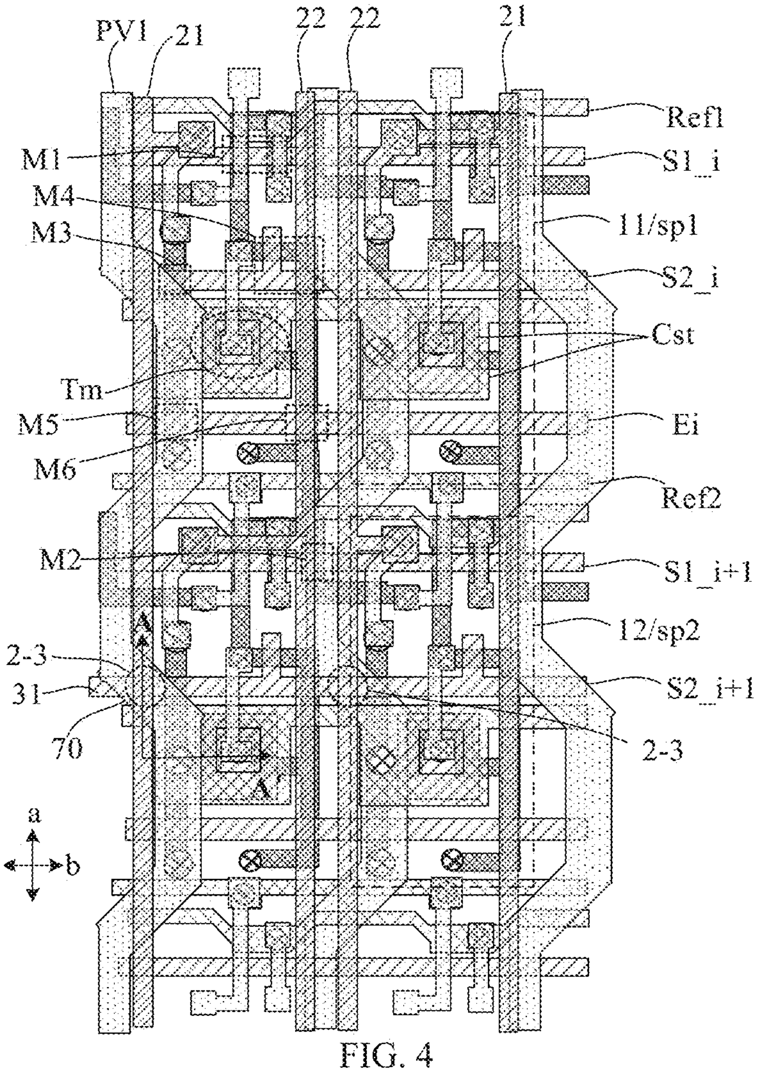
FIG. 4 is a partial diagram of a display panel according to another embodiment of the present disclosure.
Figure 5:
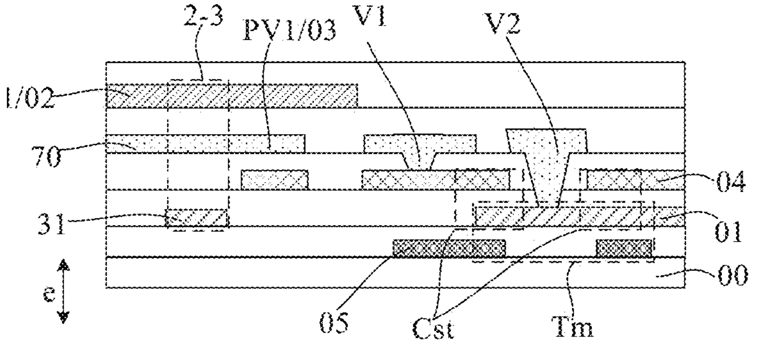
FIG. 5 is a sectional view along line A-A' shown in FIG. 4 according to an embodiment of the present disclosure.

FIG. 4 is a partial diagram of a display panel according to another embodiment of the present disclosure, and FIG. 5 is a sectional view along line A-A' shown in FIG. 4 according to an embodiment of the present disclosure. FIG. 4 schematically shows a circuit layout at a local position of the display panel, and a structure of the pixel circuit 10 in FIG. 4 can be understood in combination with the embodiment of FIG. 3.

As shown in FIG. 4, the display panel includes a first data line 21 and a second data line 22 that each extend along the first direction a, and a first signal line 31 extending along the second direction b. The first signal line 31 is one of the horizontal signal lines 30 in the embodiment of FIG. 1. The first signal line 31 crosses each of the first data line 21 and the second data line 22 to form an overlapping portion 2-3. In combination with FIG. 5, taking the overlapping portion 2-3 formed by crossing the first data line 21 and the first signal line 31 as an example, the overlapping portion 2-3 is a structure formed by a part of the first data line 21 opposite to the first signal line 31 and a part of the first signal line 31 opposite to the first data line 21 in a direction E perpendicular to a plane of the substrate 00. The first sub-pixel sp1 includes a first pixel circuit 11, the second sub-pixel sp2 includes a second pixel circuit 12, the first sub-pixel sp1 is connected to the first data line 21, and the second sub-pixel sp2 is connected to the second data line 22. Combining with the embodiment in FIG. 1, the display panel includes the gating circuit 50 which is configured to connect the output terminal of the data driver to both the first data line 21 and the second data line 22 by using multiple switch units. It can be seen from FIG. 4 that the display panel includes a shielding pattern 70 overlapping with at least one overlapping portion 2-3.

As shown in FIG. 5, a display panel includes a substrate 00, a first metal layer 01, a second metal layer 02, and a third metal layer 03. The third metal layer 03 is disposed between the first metal layer 01 and the second metal layer 02. The first metal layer 01 includes multiple first signal lines 31. The second metal layer includes the first data line 21 and the second data line 22. The third metal layer 03 includes a shielding layer, and the shielding layer includes a shielding pattern 70. That is, at the overlapping portion 2-3, the shielding pattern 70 is located between the data line 20 and the first signal line 31 in a layer stacking direction. When the output terminal of the data driver 200 provides a data signal to the data line 20 through the gating circuit 50, the shielding pattern 70 is connected to a fixed potential. For example, the shielding pattern 70 is disposed at the overlapping portion 2-3 formed by crossing the first data line 21 and the first signal line 31. When the output terminal of the data driver 200 provides a data signal to the first data line 21 by the gating circuit 50, the shielding pattern 70 is connected to a fixed potential.

The display panel provided by the embodiments of the present disclosure is provided with the gating circuit 50, and the gating circuit 50 is configured to connect the output terminals of the data driver to the first data line 21 and the second data line 22 respectively by using multiple switch units. With the gating circuit 50, the number of output terminal of the data driver can be reduced, and production cost of the data driver can be saved. The first sub-pixel sp1 is connected to the first data line 21, and the second sub-pixel sp2 is connected to the second data line 22. When the pixel circuits 10 respectively corresponding to the first sub-pixels sp1 and the second sub-pixels sp2 are alternately arranged in a pixel circuit column, the pixel circuits 10 in the same pixel circuit column 10L are alternately driven by the first data line 21 and the second data line 22. In combination with the gating circuit 50, sufficient charging time of each data line 20 can be ensured to avoid the image distortion caused by the insufficient charging of the data line. At the same time, the shielding pattern 70 is disposed at the overlapping portion 2-3 formed by crossing the data line 20 and the first signal line 31. The layer where the shielding pattern 70 is located is located between the layer where the data line is located and the layer where the first signal line 31 is located, and the shielding pattern 70 overlaps with the overlapping portion 2-3. When the output terminal of the data driver 200 provides a data signal to the data line 20 through the gating circuit 50, the shielding pattern 70 is supplied with a fixed potential, and the shielding pattern 70 can be used to form a shielding effect between the data line 20 and the first signal line 31. Such a configuration is configured to reduce the coupling effect between the data line 20 and the first signal line 31, thereby improving the crosstalk between the horizontal dark strips and the horizontal bright strips and thus improving the display effect.

FIG. 4 does not show the output terminal of the data driver 200 and the gating circuit 50 in the display panel, and the connection manner between the gating circuit 50 and the data line 20 in the display panel can refer to FIG. 1. In some embodiments of the present disclosure, the pixel circuits 10 are arranged in a pixel circuit column 10L in the first direction; the first pixel circuits 11 and the second pixel circuits 12 in the pixel circuit column 10L are arranged alternately in the first direction a, the first data line 21 is connected to the first pixel circuit 11, and the second data line 22 is connected to the second pixel circuit 12. That is, one pixel circuit column 10 1 corresponds to one first data line 21 and one second data line 22, one of the first data line 21 and the second data line 22 is connected to an odd-numbered pixel circuit 10 in the pixel circuit column 10L, and the other of the first data line 21 and the second data line 22 is connected to an even-numbered pixel circuit 10 in the pixel circuit column 10L. Combined with FIG. 1, the signal terminal 40 on the display panel is electrically connected to the output terminal of the data driver 200, so that the output terminals of the data driver 200 are connected to n first data lines 21 and n second data lines 22, where n is an integer, and n≥2. The data driver 200 outputs n first data signals and n second data signals sequentially through the output terminal. When displaying an image, firstly, the data driver 200 outputs n first data signals sequentially through the output terminal, these n first data signals are provided to n pixel circuits 10 in one pixel circuit row 10H. Then, the data driver 200 outputs n second data signals sequentially through the output terminal, and these n second data signals are provided to n pixel circuits 10 in next one pixel circuit row 10H. When driving one pixel circuit row 10H, one output terminal outputs n data signals sequentially. When two pixel circuits located in one pixel circuit column 10L and respectively located in adjacent pixel circuit rows are driven, one output terminal outputs the first data signal and the second data signal in sequence. That is, the first data line 21 is supplied with the first data signal, and the second data line 22 is supplied with the second data signal. In this way, sufficient charging time of each data line 20 can be ensured, thereby avoiding image distortion caused by insufficient charging of data lines.

FIG. 4 schematically illustrates the pixel circuits in the $i^{th}$ pixel circuit row and the $(i+1)^{th}$ pixel circuit row, where i is a positive integer. As shown in FIG. 4, the display panel includes a first power line PV1 extending along the first direction a. In some embodiments, the first power line PV1 provides a positive power signal Pvdd. The display panel includes first scan lines S1_i and S1_i+1 and second scan lines S2_i and S2_i+1, each of which extends along the second direction b. The first scan line and the second scan line can also be referred to as gating lines. The first scan line S1_i provides the first scan signal S1 to the pixel circuit in the $i^{th}$ pixel circuit row, the second scan line S2_i provides the second scan signal S2 to the pixel circuit in the $i^{th}$ pixel circuit row, the first scan line S1_i+1 provides the first scan signal S1 to the pixel circuit in the $(i+1)^{th}$ pixel circuit row, and the second scan line S2_i+1 provides the second scan signal S2 to the pixel circuit in the $(i+1)^{th}$ pixel circuit row. The display panel includes a shift driver circuit configured to drive multiple pixel circuit rows row by row, and the scan line is connected to the driving circuit. The second scan line S2_i corresponding to the $i^{th}$ pixel circuit row and the first scan line S1_i+1 corresponding to the $(i+1)^{th}$ pixel circuit row are connected to a same stage of shift register in the shift driver circuit, that is, the second scan line S2_i and the first scan line S1_i+1 transmit a same signal. The first scan line and the second scan line corresponding to one pixel circuit row are connected to adjacent two stages of shift registers in the shift driver circuit, for example, the first scan line S1_i and the second scan line S2_i corresponding to the $i^{th}$ pixel circuit row are connected to adjacent two stages of shift registers in the shift driver circuit, respectively.

FIG. 4 schematically illustrates that the display panel includes a first reset signal lien Ref1, a second reset signal line Ref2, and a light-emitting control line Ei. The first reset signal line Ref1 provides a first reset signal, the gate reset transistor M1 is connected to the first reset signal line Ref1, the second reset signal line Ref2 provides a second reset signal, and the electrode reset transistor M2 is connected to the second reset signal line Ref2. The light-emitting control line Ei is configured to provide the light-emitting control signal E to the pixel circuit corresponding to $i^{th}$ pixel circuit row.

FIG. 5 schematically shows that the display panel includes a semiconductor layer 05 and a capacitive metal layer 04. The active layer of each transistor in the pixel circuit is located in the semiconductor layer 05. One electrode plate of the storage capacitor Cst is located at the capacitor metal layer 04, another electrode plate of the storage capacitor Cst is located at the first metal layer 01, and the gate of the driving transistor Tm is located at the first metal layer 01. FIG. 5 schematically illustrates through holes V1 and V2, the through hole V1 is a through hole connected to the electrode plate of the storage capacitor Cst that is located in the capacitive metal layer 04, and the through hole V2 is a through hole connected to the gate of the driving transistor Tm.

In some embodiments, as shown in FIG. 4, the display panel includes a first power line PV1 extending along the first direction a, and the first power line PV1 transmits a first power signal which is a constant voltage signal. In some embodiments, the first power signal is the positive power signal Pvdd. The first power line PV1 is connected to the sub-pixel, that is, the first power line PV1 is connected to the pixel circuit corresponding to the sub-pixel. In combination with FIG. 5, the layer where the first power line PV1 is located is located between the first metal layer 01 and the second metal layer 02, where the shielding pattern 70 is coupled with the first power line PV1. The shielding pattern 70 and the first power line PV1 transmit a same signal, so that the shielding pattern 70 is connected to a fixed potential when the output terminal of the data driver 200 provides the data signal to the data line 20 through the gating circuit 50. The shielding pattern 70 can be used to form a shielding effect between the data line 20 and the first signal line 31 to reduce the coupling effect between the data line 20 and the first signal line 31, thereby improving the crosstalk between the horizontal dark strips and the horizontal bright strips, and thus improving the display effect. The first power line PV1 is the original signal line transmitting constant voltage signal in the display panel, coupling the shielding pattern 70 with the first power line PV1 can reduce the wiring in the display panel and save the wiring space of the display panel.

In some embodiments of the present disclosure, the shielding pattern 70 is coupled with the first power line PV1. The shielding structure 70 can be connected to the first power line PV1 in following ways. For example, part of line segments of the first power line PV1 can serve as the shielding pattern, in other words, the shielding pattern 70 and the first power line PV1 can be formed into one piece. When the first power line PV1 cannot overlap with the overlapping portion 2-3 to form an overlapping portion in an extension direction of the first power line PV1, the extension portion integrated with the first power line PV1 can be manufactured, and the extension portion can be used as the shielding pattern 70. It is also possible to manufacture the shielding pattern 70 in a different layer from the first power line PV1, and the shielding pattern 70 is electrically connected to the first power line PV1 through the through hole in the insulation layer.

In some embodiments, as shown in FIG. 4, the shielding pattern 70 and the first power line PV1 are located in a same layer, and the shielding pattern 70 and the first power line PV1 are formed into one piece. The shielding pattern 70 and the first power line PV1 are manufactured in a same process, thereby simplifying the manufacturing process.

Figure 6:
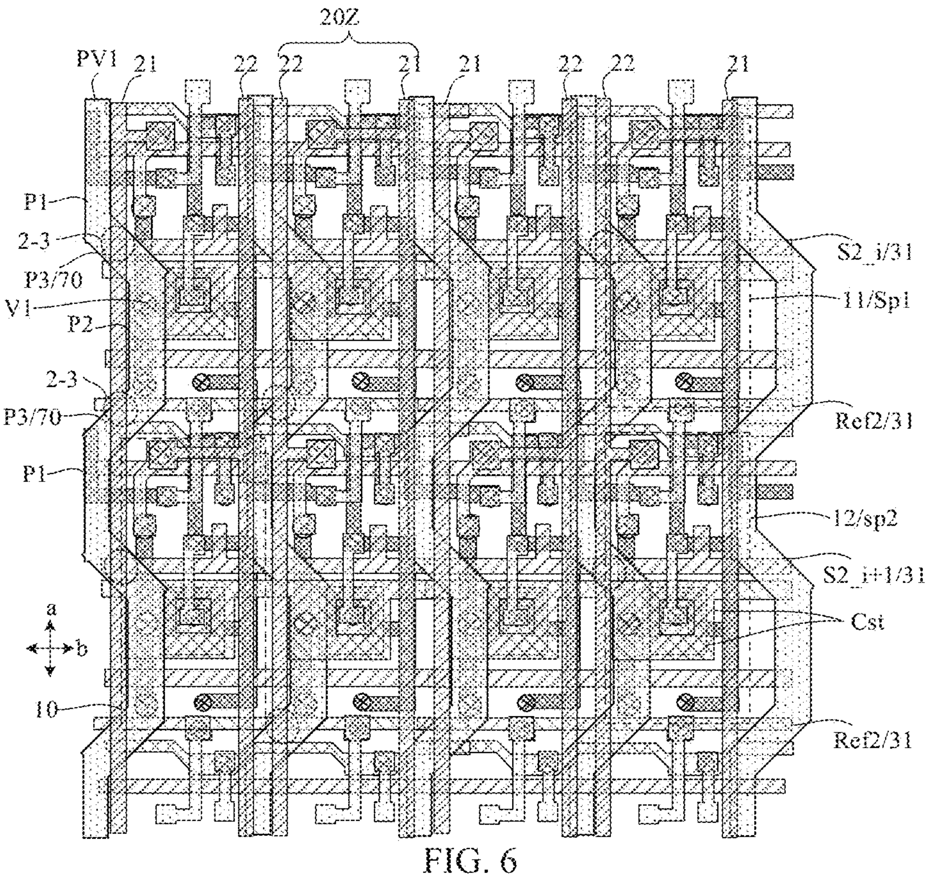
FIG. 6 is a partial schematic diagram of a display panel according to another embodiment of the present disclosure.

In some embodiments, FIG. 6 is a partial schematic diagram of a display panel according to another embodiment of the present disclosure. FIG. 6 schematically illustrates an $i^{th}$ pixel circuit row and an $(i+1)^{th}$ pixel circuit row. As shown in FIG. 6, the first power line PV1 includes a first line segment P1, a second line segment P2, and a third line segment P3. In the first direction a, the first line segment P1 and the second line segment P2 are located at two sides of the first data line 21, respectively. In the second direction b, the first line segment P1 and the second line segment P2 are located at two sides of the first signal line 31, respectively. The third line segment P3 is connected between the first line segment P1 and the second line segment P2. The dotted line in FIG. 6 circles the overlapping portions 2-3 at multiple positions. The third line segment P3 is reused as the shielding pattern 70, and overlaps with the overlapping portion 2-3 formed by the first data line 21 and the first signal line 31. In the embodiment of FIG. 6, the first signal lines 31 include second scan lines S2_i and S2_i+1, and the second reset signal line Ref2. In the embodiment, the first power line PV1 is designed as a polyline, and the third line segment P3 of the first power line PV1 serves as the shielding pattern 70, so that only the pattern shape of the first power line PV1 is designed without adding new manufacturing process, thereby leading to a simple process. At least one third segment P3 in the power line PV1 is has a shielding function at the overlapping portion 2-3 formed by the first data line 21 and the second scan line, and at least one third line P3 has a shielding function at the overlapping portion 2-3 formed by the first data line 21 and the second reset signal Ref2, so that the coupling effect between the data line 20 and multiple first signal lines 31 can be reduced, thereby improving the crosstalk between the horizontal dark strips and the horizontal bright strips, and improving the display effect.

In some embodiments, as shown in FIG. 6, pixel circuits 10 are arranged in a pixel circuit column (not shown in FIG. 6, and understood in combination with FIG. 1) in the first direction a. The pixel circuit column includes a first pixel circuit 11 and a second pixel circuit 12. The first data line 21 is connected to the first pixel circuit 11, and the second data line 22 is connected to the second pixel circuit 12. It can be seen from FIG. 6 that one pixel circuit column is driven by one first data line 21 and one second data line 22. The first data line 21 and the second data line 22 are located at two sides of the pixel circuit column, respectively. In other words, multiple pixel circuits 10 in one pixel circuit column are alternately connected to the first data line 21 and the second data line 22. The first data line 21 and the second data line 22 that are connected to a same pixel circuit column form a line group 20Z.

The storage capacitor Cst includes a first electrode plate and a second electrode plate that overlap with each other, the second electrode plate is located at a side of the first electrode plate away from the substrate 00, and the second-line segment P2 and the second electrode plate overlaps with each other and are connected to each other through the through hole (shown as V1 in FIG. 6). The structure of the storage capacitor Cst can refer to FIG. 5, the first plate is located in the first metal layer 01, and the second plate is located in the capacitive metal layer 04. The through hole V1 is a through hole connected through which the second line segment P2 in the first power line PV1 is connected to the second electrode plate.

It can be seen from FIG. 6 that the second line segment P2 is located between the first data line 21 and the second data line 22 of the same line group 20Z. In the embodiments of the present disclosure, the first power line PV1 is designed to be a polyline, so that the third line segment P3 connected between the first line segment P1 and the second line segment P2 can serve as the shielding pattern 70 to reduce the coupling effect between the data line 20 and multiple first signal lines 31, thereby improving display crosstalk between the horizontal dark strips and the horizontal bright strips. At the same time, the second line segment P2 can be just disposed between the first data line 21 and the second data line 22, and can overlap with the second electrode plate of the storage capacitor Cst. In this way, there is no need to provide the second electrode plate with an excessive large area, which can avoid unnecessary occupation of the wiring space.

Figure 7:
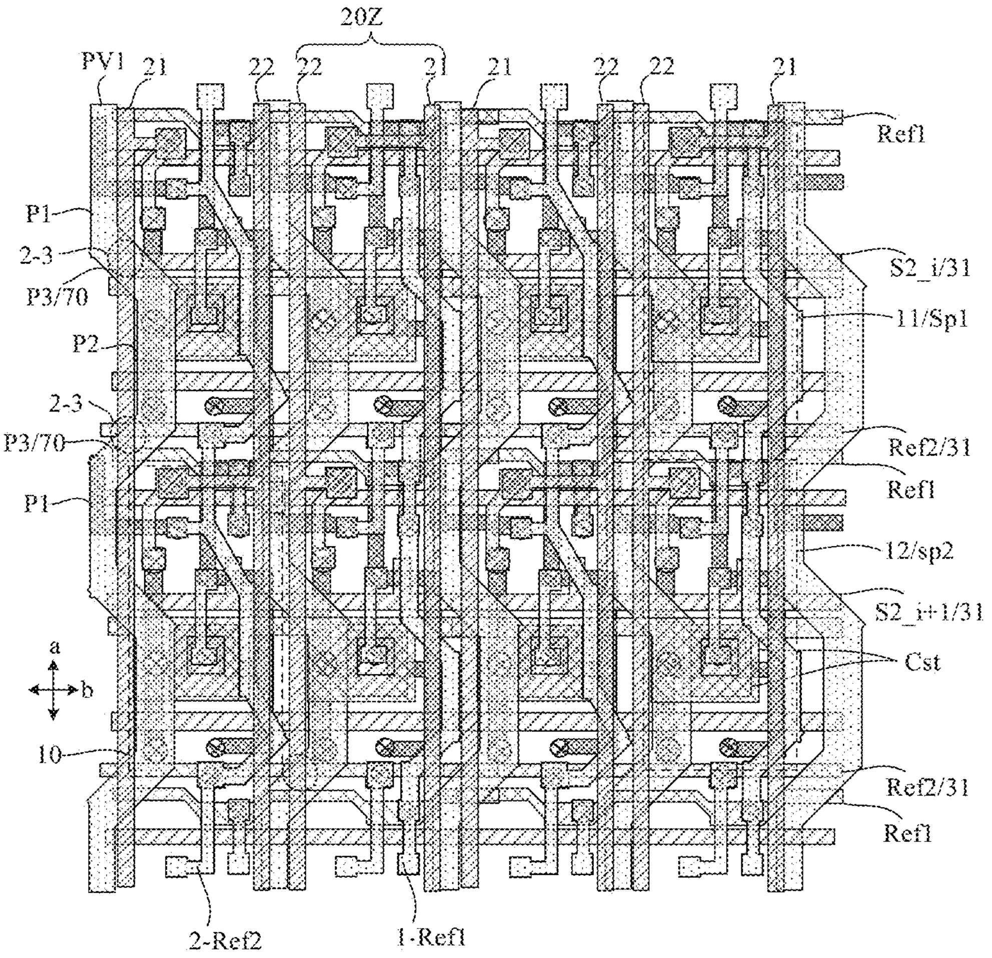
FIG. 7 is a partial schematic diagram of a display panel according to another embodiment of the present disclosure.

FIG. 7 is a partial schematic diagram of a display panel according to another embodiment of the present disclosure. In some embodiments, as shown in FIG. 7, the display panel includes a first auxiliary reset line 1-Ref1 and a second auxiliary reset line 2-Ref2 that each extend in the first direction a. The first auxiliary reset line 1-Ref1 is coupled with the first reset signal Ref1, and the second auxiliary reset line 2-Ref2 is coupled with the second reset signal line Ref2. In the second direction b, the first auxiliary reset lines 1-Ref1 and the second auxiliary reset lines 2-Ref2 are alternately arranged. Such configuration can reduce the voltage drop when transmitting the first reset signal, and the voltage drop when transmitting the second reset signal, thereby improving the uniformity of the first reset signal and the second reset signal in the display panel, and improving the display uniformity.

In some embodiments, the first auxiliary reset line 1-REF1 and the second auxiliary reset line 2-REF2 are located in a same layer as the first power line PV1.

Figure 8:
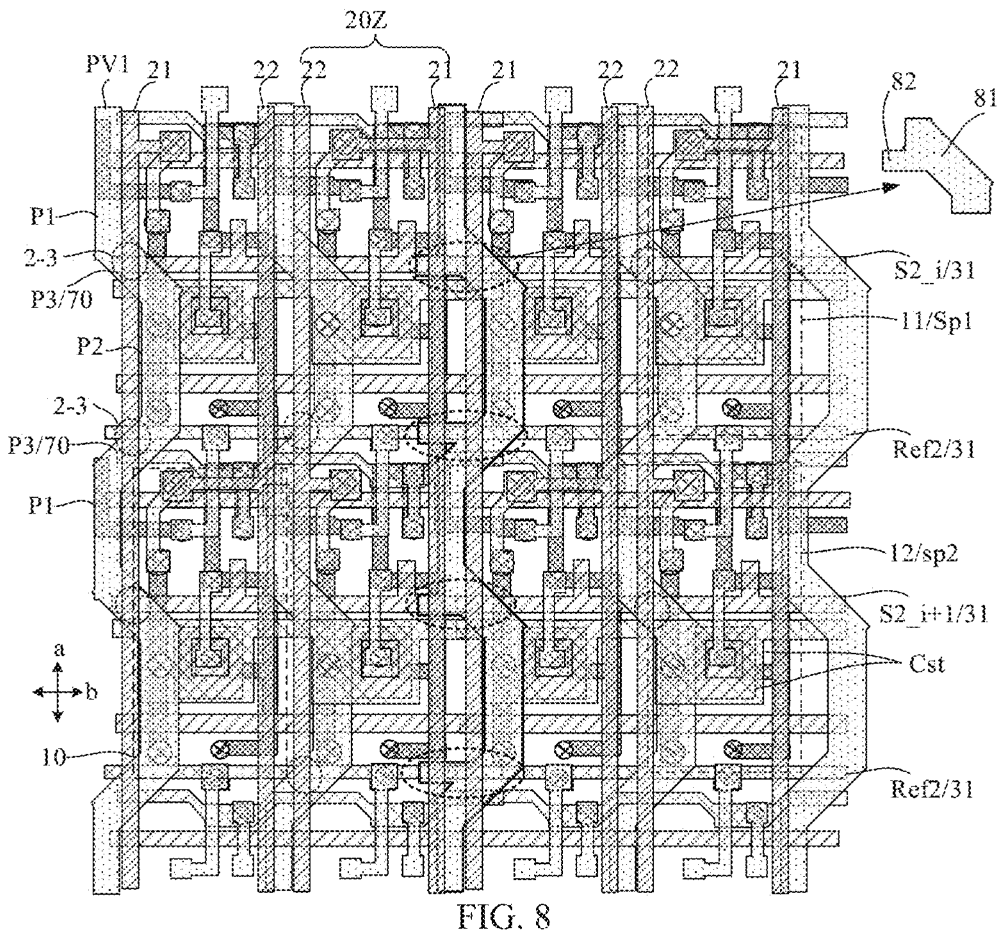
FIG. 8 is a partial schematic diagram of a display panel according to another embodiment of the present disclosure.

FIG. 8 is a partial schematic diagram of a display panel according to another embodiment of the present disclosure. In some embodiments, as shown in FIG. 8, a third one of the first power lines PV1 from left to right includes a third segment P3 including a first body 81 and a first extension portion 82. An enlarged view of FIG. 8 in the upper right corner illustrates a shape of the third segment P3. The first extension portion 82 overlaps with the overlapping portion formed by one data line and the first signal line 31. The first data line 21 overlapping with the first body 81 and the second data line 22 overlapping with the first extension portion 82 belong to two adjacent line groups 20Z, respectively. In the embodiment, the shape of the third line segment P3 is designed so that the third line segment P3 includes the first body 81 and the first extension portion 82, thereby the third line segment P3 overlapping with two overlapping portions 2-3, one first power line PV1 is configured to shield the overlapping portions 2-3 formed by the first signal line 31 and two data lines located at two sides of the first power line PV1, the shape of the first power line PV1 is changed slightly, the number of sites for shielding the overlapping portion 2-3 increases, so that the coupling effect between the data line 20 and the first signal line 31 can be improved more, thereby improving the display crosstalk between the horizontal dark strips and the horizontal bright strips.

In some embodiments, the first power line PV1 includes a body and an extension portion. The body extends along the first direction a, and the extension portion protrudes outwardly from the body along the second direction b. The extension portion is reused as a shielding pattern 70, and the extension portion overlaps with at least one overlapping portion 2-3. Adding the extension portion on the body for the first power line PV1, and overlapping the extension portion with the overlapping portion 2-3 by reusing the shielding pattern 70, are reached by only designing the line shape of the first power line PV1, so that no manufacturing process is added, thereby having a simple manufacturing process. With the extension portion, the resistance of the first power line PV1 and the voltage drop when transmitting the first power signal, can be reduced, which improves the display uniformity.

In some embodiments of FIG. 8, the first body 81 of the third line segment P3 is equivalent to the body, and the first extension portion 82 of the third line segment P3 is equivalent to the extension portion.

Figure 9:
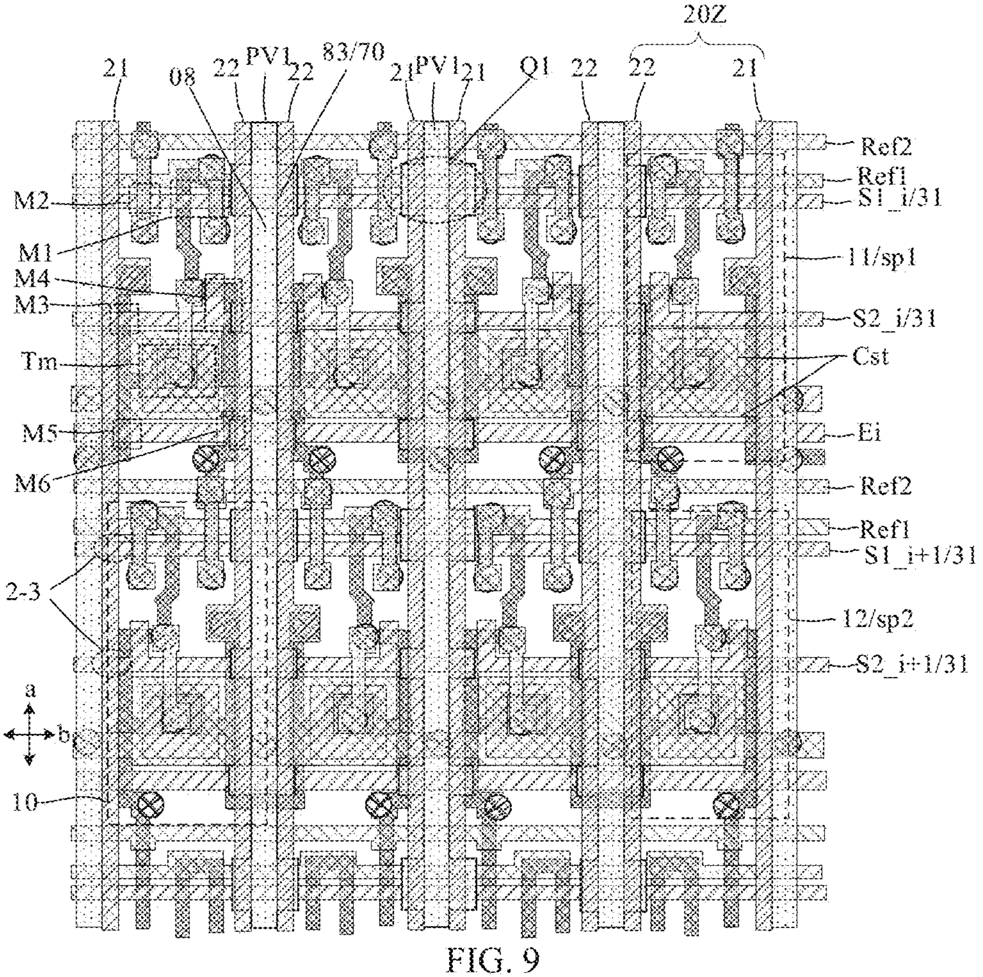
FIG. 9 is a partial schematic diagram of a display panel according to another embodiment of the present disclosure.
Figure 10:
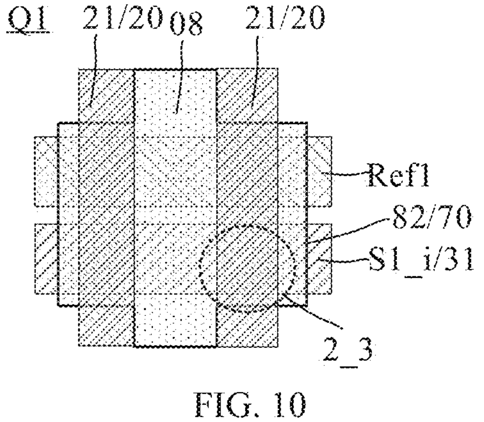
FIG. 10 is a partial enlarged diagram at a region Q1 shown in FIG. 9 according to an embodiment of the present disclosure.

FIG. 9 is a partial schematic diagram of a display panel according to another embodiment of the present disclosure, and FIG. 10 is a partial enlarged diagram at a region Q1 shown in FIG. 9 according to an embodiment of the present disclosure. FIG. 9 schematically shows the pixel circuits 10 in the $i^{th}$ pixel circuit row and the $(i+1)^{th}$ pixel circuit row, where i is a positive integer. For each signal line and each transistor in FIG. 9 can be understood by combining with the embodiments of FIG. 3 and FIG. 4, which will not repeated herein.

As shown in FIG. 9, the pixel circuits are arranged in a pixel circuit column (not marked in FIG. 9) along the first direction a. The pixel circuit column includes a first pixel circuit 11 and a second pixel circuit 12. The first data line 11 is connected to the first pixel circuit 11, and the second data line 22 is connected to the second pixel circuit 12. One pixel circuit column corresponds to one first data line 21 and one second data line 22. The first data line 21 and the second data line 22 are located at two sides of the pixel circuit column, respectively. The first data line 21 and the second data line 22 that are connected to the same pixel circuit column constitute a line group 20Z. In the second direction b, the first data line 21 in one line group 20Z is adjacent to the first data line 21 in another line group 20Z, and the second data line 22 in one line group 20Z is adjacent to the second data line 22 in another line group 20Z. The display panel includes a first signal line 31. The first signal line 31 crosses each of the first data line 21 and the second data line 22 to form the overlapping portion 2-3. The dotted line in FIG. 9 only circles the overlapping portion 2-3 at some positions.

The first power line PV1 includes a body 08 located between two adjacent data lines 20, and two data lines 20 located at two sides of the body 08 are located in two adjacent line group 20Z, respectively. It can be seen from FIG. 9 that there is a first power line PV1 whose body 08 is located between two adjacent first data lines 21, and there is also another first power line PV1 whose body 08 is located between two adjacent second data lines 22.

In combination with FIG. 9 and FIG. 10, the first power line PV1 includes the body 08 and the extension portion. The extension portion includes a second extension portion 82. The second extension portion 82 overlaps with the overlapping portion 2_3 formed by the first data line 21 and the first signal line 31. The second extension portion 82 serves as a shielding pattern 70. The layer of the second extension portion 82 is located between the first data line 21 and the first signal line 31. FIG. 10 schematically shows that two second extension portions extend from the body 08 to a left side and a right side, respectively, to overlap with the overlapping portions 2-3 respectively formed by the first signal line 31 and the first data lines 21 respectively located at left and right sides of the body 08.

As shown in FIG. 9, at the position where two data lines 22 are adjacent to each other, the extension portion of the first power line PV1 includes a third extension portion 83. The shape of the third extension portion 83 is similar to the shape of the second extension portion 82. The third extension portion 83 can be understood with reference to the second extension portion 82. The third extension portion 83 overlaps with the overlapping portion formed by the second data line 22 and the first signal line 31. The third extension portion 83 serve as the shielding pattern 70. FIG. 9 schematically shows that two third extension portions 83 extend from the body 08 towards the left and right sides, respectively, to respectively overlap with the overlapping portions 2-3 respectively formed by the first signal line 31 and the second data lines 22 respectively located at left and right sides of the body 08.

In this embodiment, the body 08 of the first power line PV1 is located between two adjacent data lines 20, extension portions are manufactured at two sides of the body 08, so that the extension portion shields the overlapping portion 2-3 formed by the first signal line 31 of the data line 20, which can reduce the coupling effect between the data line and first signal line 31, and improve the display crosstalk between the horizontal dark strips and the horizontal bright strips. Only the line shape of the first power line PV1 can be designed without adding new manufacturing process, thereby leading to a simple process. The design of the extension portion can reduce the resistance of the first power line PV1, and the voltage drop of transmitting the first power signal, which improves the display uniformity.

FIG. 9 schematically shows that the first data line 21 and the second data line 22 cross the first scan lines S1_i and S1_i+1, the second scan lines S2_i and S2_i+1, the light-emitting control line Ei, the first reset signal Ref1, and the second reset signal Ref2, respectively, to form overlapping portions. The extension portion of the first power line PV1 can serve as the shielding pattern 70 by adopting the configuration shown in FIG. 9 at any overlapping portion.

Figure 11:
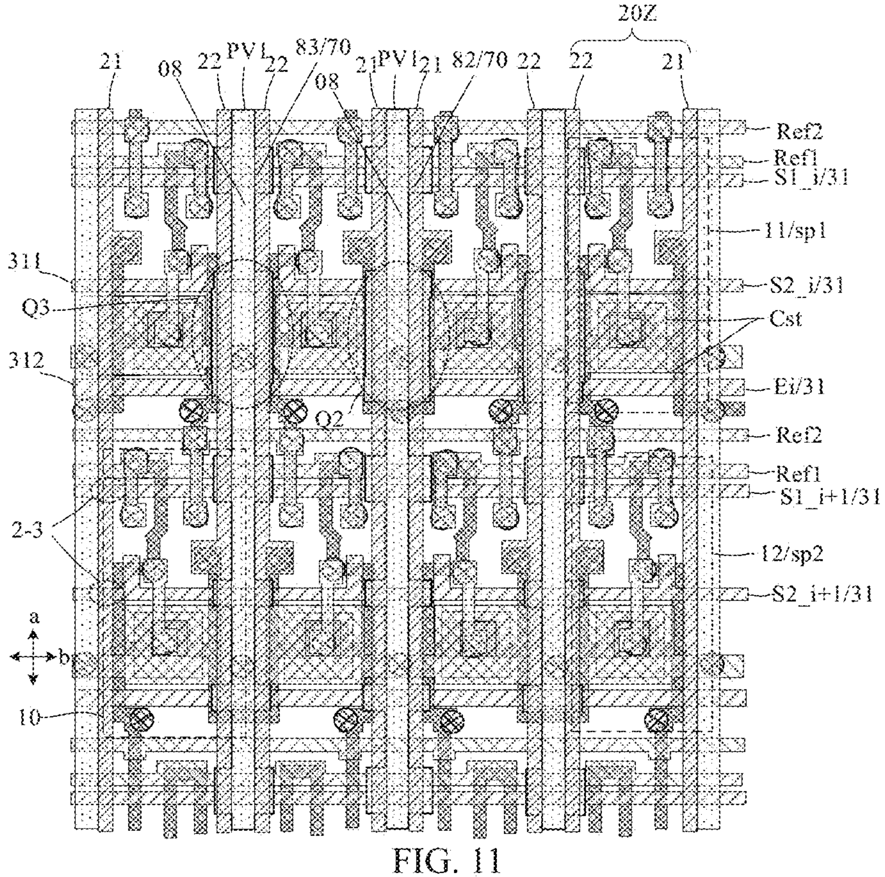
FIG. 11 is a partial schematic diagram of a display panel according to another embodiment of the present disclosure.
Figure 12:
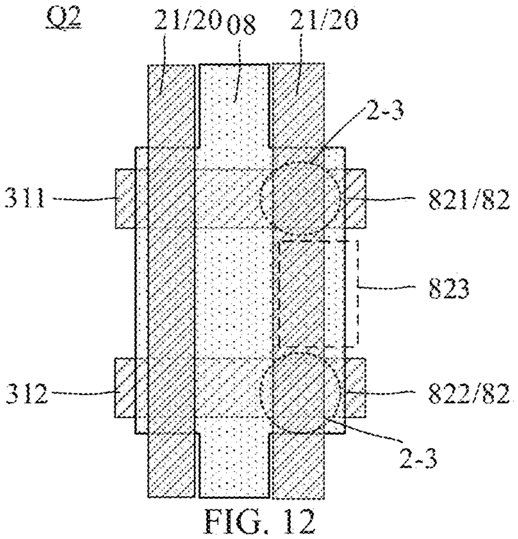
FIG. 12 is an enlarged diagram of a region Q2 shown in FIG. 11 according to an embodiment of the present disclosure.

FIG. 11 is a partial schematic diagram of a display panel according to another embodiment of the present disclosure, and FIG. 12 is an enlarged diagram of an area Q2 shown in FIG. 11 according to an embodiment of the present disclosure. In some embodiments, as shown in FIG. 11, the first signal line 31 includes a first signal sub-line 311 and a second signal sub-line 312 that are adjacent to each other along the first direction a. The first data line 21 and the second data line 22 cross the first signal sub-line 311 and the second signal sub-line 312 to form overlapping portions 2-3.

In order to clearly show the structure of the first power line PV1, FIG. 12 just schematically shows only the first data line 21, the first signal sub-line 311, the second signal sub-line 312, and the first power line PV1. As shown in FIG. 12, the second extension portion 82 includes a first extension sub-portion 821 and a second extension sub-portion 822. The first extension sub-portion 821 overlaps with the overlapping portion 2-3 formed by the first data line 21 and the first signal sub-line 311. The second extension sub-portion 822 overlaps with the overlapping portion 2-3 formed by the first data line 21 and the second signal sub-line 312. The first power line PV1 further includes a first connection portion 823 connected between the first extension sub-portion 821 and the second extension sub-portion 822. In this embodiment, the first extension sub-portion 821 is used to have a shielding effect at the position of the overlapping portion 2-3 formed by the first data line 21 and the first signal sub-line 311, to reduce the coupling effect between the first data line 21 and the first signal sub-line 311. The second extension sub-portion 822 is used to have a shielding effect at the position of the overlapping portion 2-3 formed by the first data line 21 and the second signal sub-line 312, so as to reduce the coupling effect between the first data line 21 and the second signal sub-line 312, thereby improving the display crosstalk between the horizontal dark strips and the horizontal bright strips. The first connection portion 823 is connected between the first extension sub-portion 821 and the second extension sub-portion 823, the first connection portion 823 does not overlap with the overlapping portion 2-3, disposing the first connection portion 823 can increase the area of the first power line PV1, thus reducing the resistance of the first power line PV1 and the voltage drop of transmitting the first power signal, which is helpful to improve the display uniformity.

In FIG. 11, the body 08 of the first power line PV1 in the region Q3 is located between two second data lines 22. The first power line PV1 includes a third extension portion 83. The third extension portion 83 overlaps with an overlapping portion formed by the second data line 22 and the first signal line 31. The shape of the first power line PV1 at area Q3 is similar to that of the first power line PV1 in the region Q2. It can be understood that in the region Q3, the second data line 22 crosses the first signal sub-line 311 and the second signal sub-line 312 respectively to form the overlapping portions. The third extension portion 83 includes the third extension sub-portion and the fourth extension sub-portion. The third extension sub-portion overlaps with the overlapping portion formed by the second data line 22 and the first signal sub-line 311. The fourth extension sub-portion overlaps with the overlapping portion formed by the second data line 22 and the second signal sub-line 312. The first power line PV1 includes a second connection portion connected between the third extension sub-portion and the fourth extension sub-portion. The third extension sub-portion is used to have a shielding effect at the overlapping portion formed by the second data line 22 and the first signal sub-line 311, to reduce the coupling effect between the second data line 22 and the first signal sub-line 311. The fourth extension sub-portion is used to have a shielding effect at the overlapping portion formed by the second data line 22 and the second signal sub-line 312, so as to reduce the coupling effect between the second data line 22 and the second signal sub-line 312, thus improving the display crosstalk between the horizontal dark strips and the horizontal bright strips. The second connection portion is connected between the third extension sub-portion and the fourth extension sub-portion, the second connection portion does not overlap with the overlapping portion, and with the second connection portion, the area of the first power line PV1 can be increased, then the resistance of the first power line PV1 is reduced, and the voltage drop of transmitting the first power signal is reduced, which improves the display uniformity.

Figure 13:
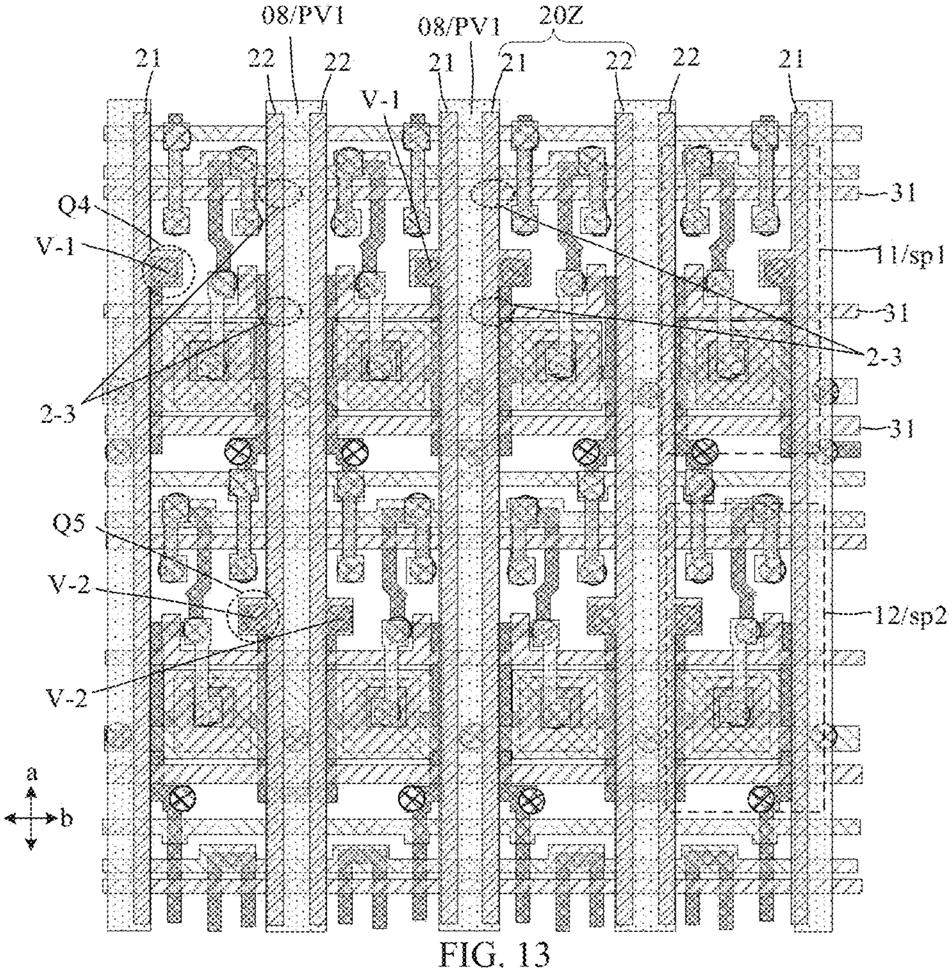
FIG. 13 is a partial schematic diagram of a display panel according to another embodiment of the present disclosure.

FIG. 13 is a partial schematic diagram of a display panel according to another embodiment of the present disclosure. In some embodiments, as shown in FIG. 13, the first power line PV1 includes a body 08 having a strip shape. The body 08 partially overlaps with the first data line 21. The first data line 21 includes a first protruding portion. The first protruding portion is not marked in FIG. 13. FIG. 13 schematically shows four first data lines 21 and four second data lines 22 from left to right. The first protruding portion of the Pt first data line 21 is located in the region Q4, and protrudes towards the right side, and, similarly, the first protruding portion of the $2^{nd}$ first data line 21 protrudes towards the left side. The body 08 of the first power line PV1 does not overlap with the first protruding portion of the first data line 21, and the first protruding portion is connected to the first sub-pixel sp1 through a first through hole V-1. As shown in FIG. 13, the first data line 21 and the second data line 22 corresponding to a pixel circuit column define a line group 20Z, the first power line PV1 is located between two adjacent data lines, and two data lines at two sides of the first power line PV1 are located in two line groups 20Z, respectively, that is, a first power line PV1 is located between two adjacent first data lines 21, and a first power line PV1 is located between two adjacent second data lines 22. The first power line PV1 between two first data lines 21 is manufactured to have a large line width, so that the body 08 of the first power line PV1 overlaps with the first data line 21, and thus the body 08 of the first power line PV1 can be used to overlap with the overlapping portion 2-3. FIG. 13 only schematically shows the positions of some of the overlapping portions 2-3. At the same time, the body 08 of the first power line PV1 does not overlap with the first protruding portion, ensuring that the first data line 21 is connected to the first sub-pixel sp1 through the first protruding portion. When manufacturing the display panel, the power line PV1 21 has a large line width such that the power line PV1 21 overlaps with the first data line 21. Thus at least one line segment of the first power line PV1 can serve as the shielding pattern 70 to reduce the coupling effect between the first data line 21 and the first signal line 31, thereby improving display crosstalk between the horizontal dark strips and the horizontal bright strips. At the same time, with the configuration that the first power line PV1 has a large line width, the resistance of the first power line PV1 can be reduced, and the voltage drop when transmitting the first power signal can be reduce, which improves the display uniformity.

In some embodiments, as shown in FIG. 13, the body 08 of at least one first power line PV1 partially overlaps with the second data line 22. The second data line 22 includes a second protruding portion (not marked in FIG. 13). The second protruding portion of the 1$^{st}$ second data line 22 numbered from left to right is located in the region Q5, and protrudes towards the left side, and similarly, the second protruding portion of the 2$^{nd}$ second data line 22 protrudes towards the right side. The body 08 of the first power line PV1 does not overlap with the second protruding portion of the second data line 22, and the second protruding portion is connected to the second sub-pixel sp2 through a second through hole V-2. The first power line PV1 between two second data lines 22 has a large line width, so that the body 08 of the first power line PV1 overlaps with the second data line 22, at least one line segment of the first power line PV1 can serve as the shielding pattern 70 to reduce the coupling effect between the second data line 22 and the first signal line 31, thereby improving display crosstalk between the horizontal dark strips and the horizontal bright strips. At the same time, the first power line PV1 has a large line width, which can reduce the resistance of the first power line PV1, and the voltage drop when transmitting the first power signal, thereby improving the display uniformity.

Figure 14:
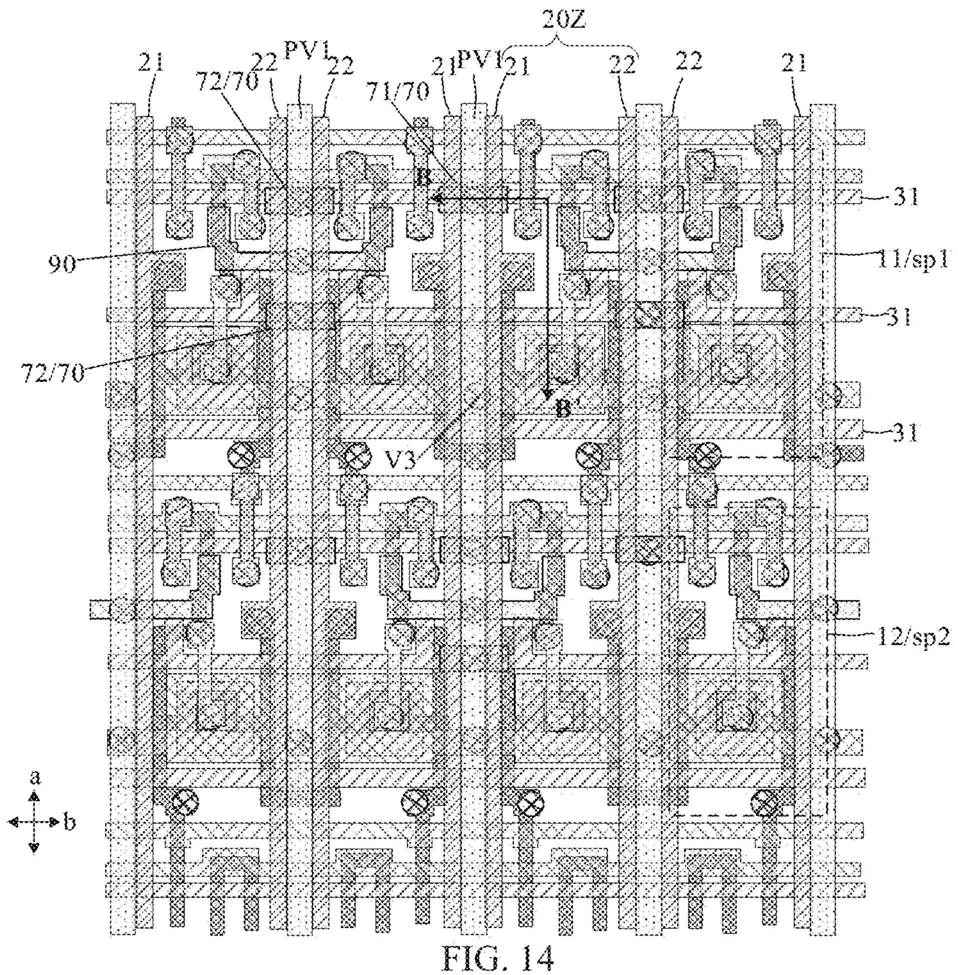
FIG. 14 is a partial schematic diagram of a display panel according to another embodiment of the present disclosure.

In some embodiments, the shielding pattern 70 is connected to the first power line PV1, and located in a different layer from the first power line PV1. FIG. 14 is a partial schematic diagram of a display panel according to another embodiment of the present disclosure, and FIG. 15 is a sectional view along line B-B' shown in FIG. 14 according to an embodiment of the present disclosure.

As shown in FIG. 14, the shielding pattern 70 includes a first shielding pattern 71 and a second shielding pattern 72. The first shielding pattern 71 overlaps with the overlapping portion formed by crossing the first data line 21 and the first signal line 31, and the second shielding pattern 72 overlaps with the overlapping portion formed by crossing the second data line 22 and the first signal line 31. The overlapping portion is not marked in FIG. 14, and can be understood with reference to the above related embodiments.

Figure 15:
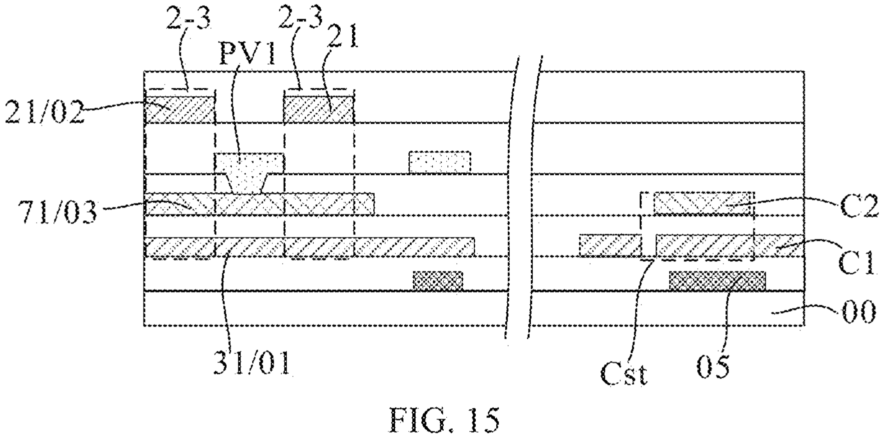
FIG. 15 is a sectional view along line B-B' shown in FIG. 14 according to an embodiment of the present disclosure.

In combination with FIG. 15, the pixel circuit includes a storage capacitor Cst. The storage capacitor Cst includes a first electrode plate C1 and a second electrode plate C2. The second plate C2 is located at a side of the first electrode plate C1 away from the substrate 00. The first power line PV1 and the second electrode plate C2 overlap with each other and are connected to each other through a through hole. The through hole configured to connect the first power line PV1 and the second electrode plate C2 is the through hole V3 as indicated in FIG. 14. The first shielding pattern 71 and the second shielding pattern 72 are located at the third metal layer 03. The first shielding pattern 71 and the second electrode plate C2 are located in a same layer. In some embodiments, in the storage capacitor Cst, the first electrode plate C1 and the first signal line 31 are located in a same layer, so that the layer where the second electrode plate C2 is located is located between the first metal layer 01 and the second metal layer 02, the layer where the second electrode plate C2 is located is used to manufacture the shielding pattern 70, which can achieve that the shielding pattern 70 is located between the data line and the first signal line 31 at the overlapping portion 2-3, thereby shielding the coupling effect between the data line and the first signal line 31 by using the shielding pattern 70. Such configuration uses the original layer in the display panel to manufacture the shielding pattern 70 without adding new manufacturing process, thereby leading to a simple manufacturing process.

In some embodiments, as shown in FIG. 15, the shielding pattern 70 is located in the third metal layer 03, and the first power line PV1 is located at a side of the third metal layer 3 away from the substrate 00, that is, the shielding pattern 70 and the first power line PV1 are disposed in different layers. The shielding pattern 70 and the first power line PV1 are connected to each other through a through hole in the insulation layer to realize that the shielding pattern 70 is connected to the first power line PV1. Therefore, when the output terminal of the data driver 200 provides a data signal to the data line 20 through a gating circuit 50, the shielding pattern 70 can be supplied with the fixed potential, to form a shielding effect between the data line 20 and the first signal line 31 by using the shielding pattern 70.

In some embodiments, as shown in FIG. 14, the display panel includes a voltage regulation structure 90. The voltage regulation structure 90 is coupled with the first power line PV1, and is configured to stabilize the potential (i.e., the potential at the node N1 in the pixel circuit diagram of FIG. 3) of the gate of the driving transistor Tm. In some embodiments, the voltage regulation structure 90 and the second electrode plate of the storage capacitor Cst are located in a same layer.

Figure 16:
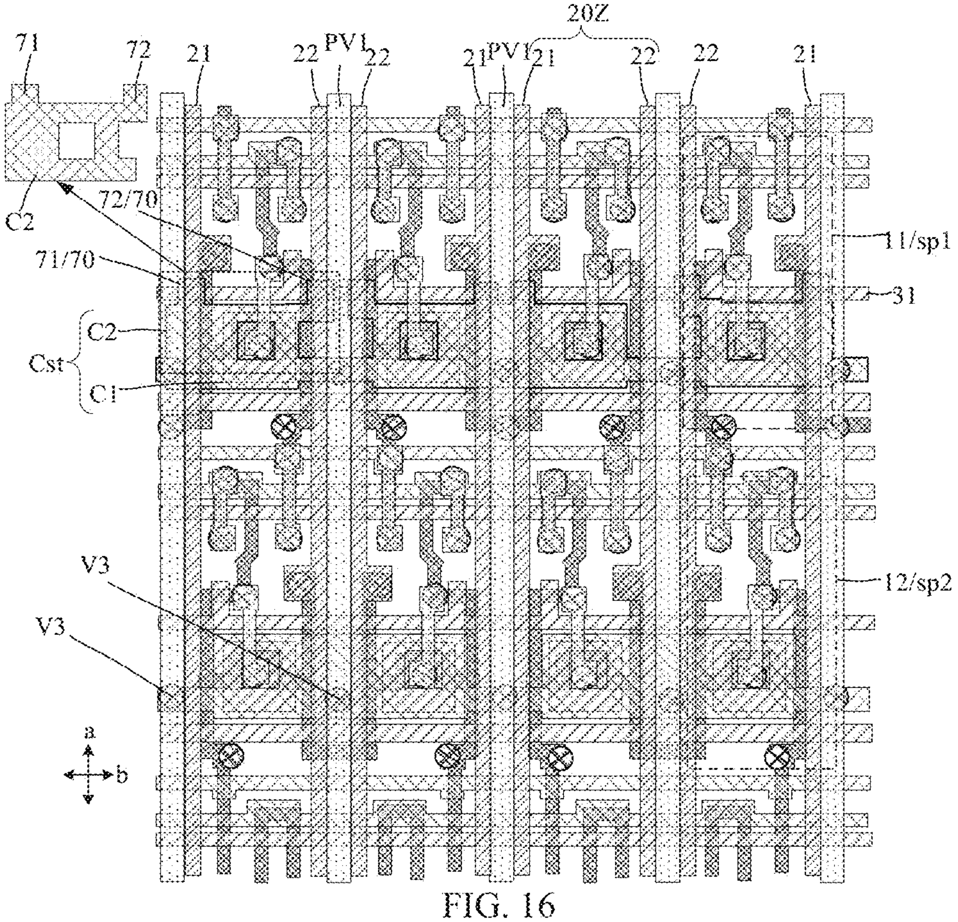
FIG. 16 is a schematic diagram of a display panel according to another embodiment of the present disclosure.

FIG. 16 is a schematic diagram of a display panel according to another embodiment of the present disclosure. In some embodiments, the enlarged diagram of FIG. 16 at the left shows that the shape of the second electrode plate C2 within one pixel circuit, and a hollow area in the middle of the second electrode plate C2 is to ensure that the through hole within the hollow region can be connected to the first electrode plate C1 (also used as a gate of the driving transistor) below the second electrode plate C2. In the embodiments of FIG. 16, the shielding pattern 70 includes a first shielding pattern 71 and a second shielding pattern 72. The first shielding pattern 71 overlaps with the overlapping portion formed by crossing the first data line 21 and the first signal line 31, and the second shielding pattern 72 overlaps with the overlapping portion formed by crossing the second data line 22 and the first signal line 31. The overlapping portion is not marked in FIG. 16, and can be understood with reference to the above related embodiments. The first signal line 31 shown in FIG. 16 is a scan line. As shown in FIG. 16, the shielding pattern 70 and the second electrode plate C2 of the storage capacitor Cst are formed into one piece. The second electrode plate C2 is connected to the first power line PV1 through a through hole V3, thereby achieving that the shielding pattern 70 is coupled with the first power line PV1. In the embodiment, the shape of the second electrode plate C2 is changed to form the shielding pattern 70, to manufacture the shielding pattern 70 without adding new manufacturing process, thereby leading to a simple manufacturing process. There is no need to provide the shielding pattern 70 disposed in a different layer from the first power line PV1 with a new through hole for connection, which reduces the number of holes punched in the display panel, thereby saving the wiring space of the display panel.

Figure 17:
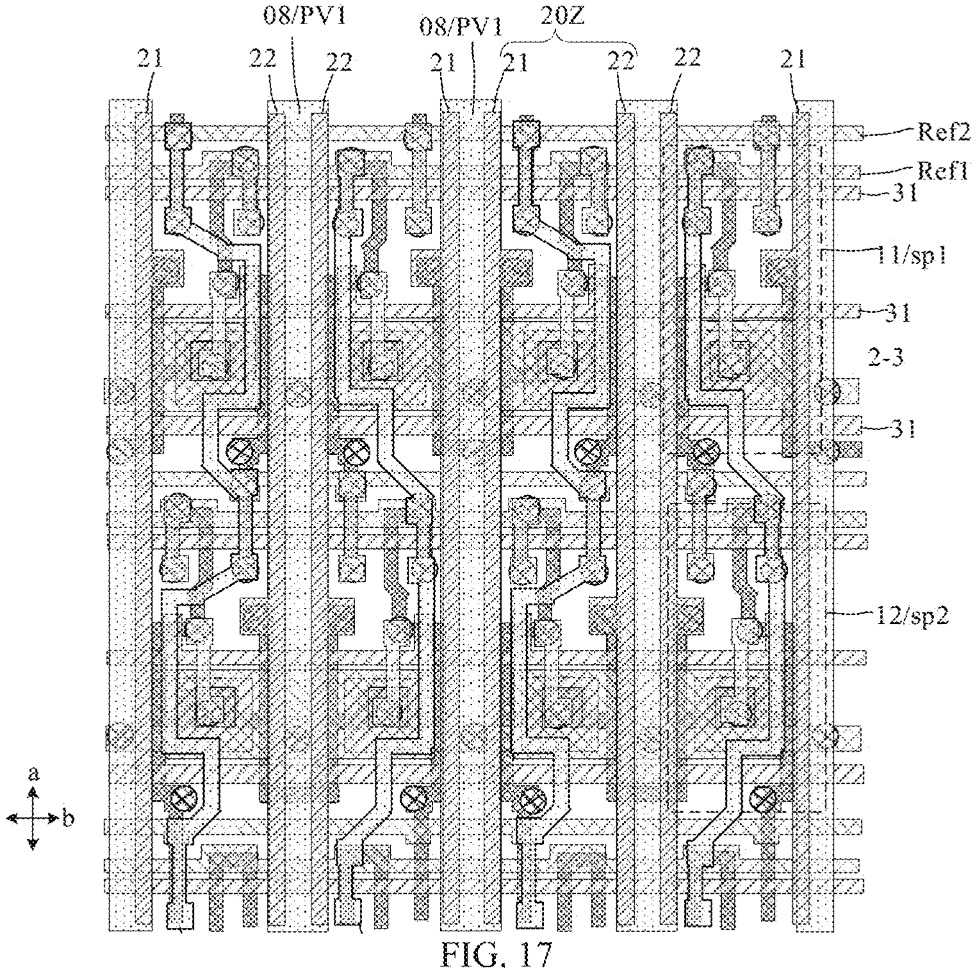
FIG. 17 is a schematic diagram of a display panel according to another embodiment of the present disclosure.

FIG. 17 is a schematic diagram of a display panel according to another embodiment of the present disclosure. In some embodiments, as shown in FIG. 17, the display panel includes a first auxiliary reset line 1-Ref1 and a second auxiliary reset line 2-Ref2 that each extend in the first direction a. The first auxiliary reset line 1-Ref1 is coupled with the first reset signal Ref1, and the second auxiliary reset line 2-Ref2 is coupled with the second reset signal line Ref2. In the second direction b, the first auxiliary reset lines 1-Ref1 and the second auxiliary reset lines 2-Ref2 are alternately arranged. In some embodiments, the first auxiliary reset line 1-Ref1 and a second auxiliary reset line 2-Ref2 are located in a same layer as the first power line PV1. This embodiment can reduce the voltage drop when transmitting the first reset signal, and the voltage drop when transmitting the second reset signal, thereby improving the uniformity of the first reset signal and the second reset signal in the display panel, and improving the display uniformity.

Figure 18:
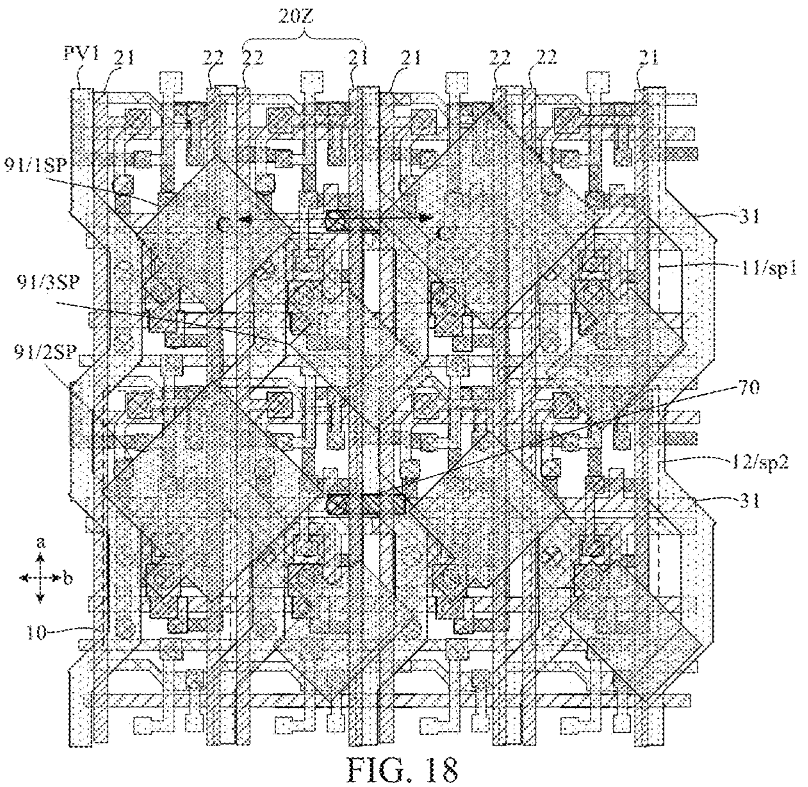
FIG. 18 is a partial schematic diagram of a display panel according to another embodiment of the present disclosure.
Figure 19:
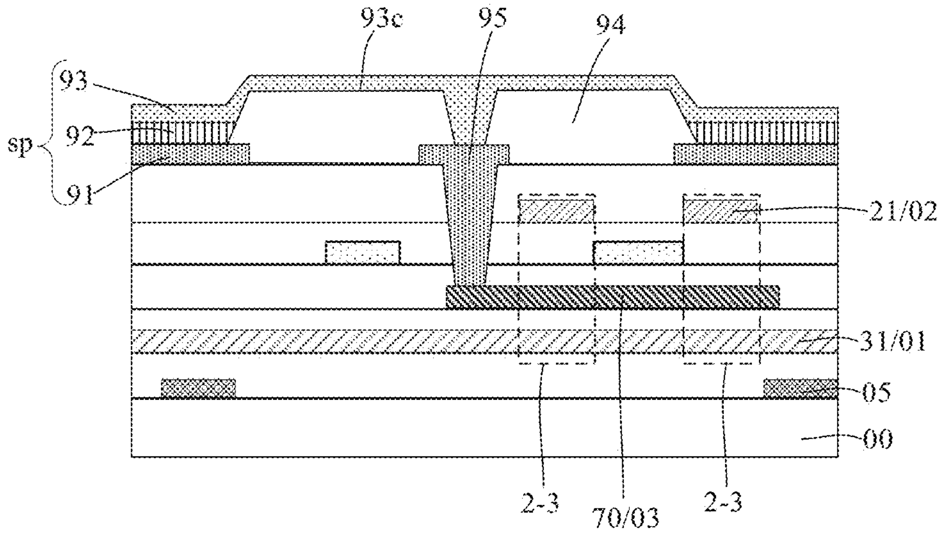
FIG. 19 is a sectional view along line C-C' shown in FIG. 18 according to an embodiment of the present disclosure.

In some embodiments, FIG. 18 is a partial schematic diagram of a display panel according to another embodiment of the present disclosure, and FIG. 19 is a sectional view along line C-C' shown in FIG. 18 according to an embodiment of the present disclosure. The sub-pixels of the display panel include a first color sub-pixel 1SP, a second color sub-pixel 2SP, and a third color sub-pixel 3SP that have different colors. FIG. 18 schematically shows that the first electrode 91 corresponding to the sub-pixels with different colors. FIG. 18 marks one shielding pattern 70. The shielding pattern 70 overlaps with the overlapping portion 2-3 formed by crossing the first data line 21 and the first signal line 31.

As shown in FIG. 19, the first data line 21 and the first signal line 31 cross to form an overlapping portion 2-3, the first data line 21 is located in the second metal layer 02, the first signal line 31 is located in the third metal layer 03, and the shielding pattern 70 is located in the third metal layer 03 located between the second metal layer 02 and the first metal layer 01. The sub-pixel SP includes a first electrode 91, a light-emitting layer 92, and a second electrode 93 that are stacked together. The second electrodes 93 of multiple sub-pixels sp are connected to each other to from a common electrode 93*c*. The display panel includes a pixel definition layer 94 configured to separating adjacent sub-pixels sp apart from each other. The common electrode 93*c* is configured to transmit a second power signal. In some embodiments, the first power signal is a positive power signal, and the second power signal is a negative power signal. That is, the first electrode 91 is an anode of the sub-pixel sp, and the second electrode 93 is a cathode of the sub-pixel sp. As shown in FIG. 19, the shielding pattern 70 is coupled with the common electrode 93*c*. The shielding pattern 70 is connected to the second power signal that is a constant voltage signal, so that the shielding pattern 70 is supplied with a fixed potential. when the output terminal of the data driver 200 provides a data signal to the data line 20 through the gating circuit 50, the shielding pattern 70 is connected to the fixed potential, and the shielding pattern 70 can be used to form a shielding effect between the data line 20 and the first signal line 31 Such a configuration reduces the coupling effect between the data line 20 and the first signal line 31, thereby improving the crosstalk between the horizontal dark strips and the horizontal bright strips, and improving the display effect.

In some embodiments, as shown in FIG. 19, the display panel includes an adapter electrode 95. The layer where the adapter electrode 95 is located is located between the third metal layer 03 and the common electrode 93*c*. The shielding pattern 70 is coupled with the common electrode 93*c* through the adapter electrode 95. The shielding pattern 70 is electrically connected to the adapter electrode 95 through a through hole in an insulation layer, and the adapter electrode 95 is electrically connected to the common electrode 93*c* through the through hole in the insulation layer. Such configuration can make the depth of the through hole located between the shielding pattern 70 and the adapter electrode 95, and the through hole located between the adapter electrode 95 and the common electrode 93*c* not excessively deep, so as to ensure the reliability of the through hole connection. The size of the through hole is not excessively large, which can avoid the occupation of wiring space.

Figure 20:
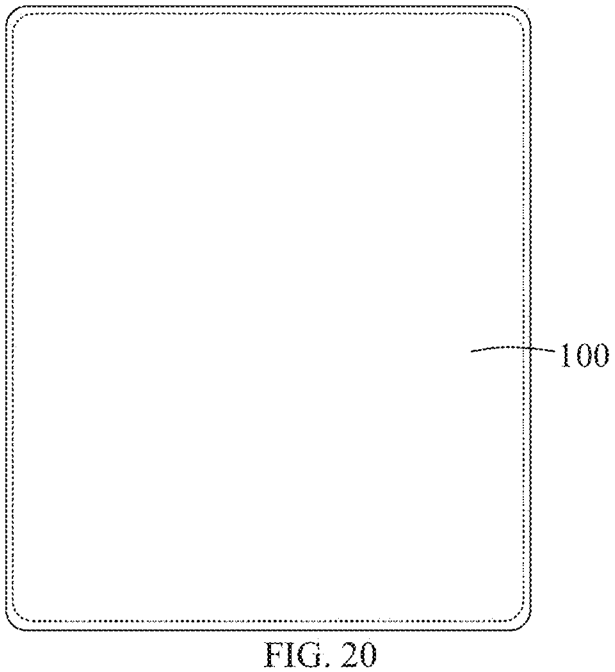
FIG. 20 is a schematic diagram of a display apparatus according to an embodiment of the present disclosure.

The present disclosure provides a display apparatus. FIG. 20 is a schematic diagram of a display apparatus according to an embodiment of the present disclosure. As shown in FIG. 20, the display apparatus includes a display panel 100 provided by any embodiment of the present disclosure. The structure of the display panel 100 has been described in the above embodiments and will not be repeated herein. The display apparatus provided by some embodiments of the present disclosure can be an electronic device such as a mobile phone, a tablet computer, a computer, a television, etc.

The above descriptions are only some embodiments of the present disclosure and are not intended to limit the present disclosure. Any modifications, equivalent alternatives, or improvements that are made without departing from the spirits and principles of the present disclosure should be encompassed by the scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the embodiments described herein, and can make various obvious modifications or replacements without departing from the scope of the present disclosure.

What is claimed is:

1. A display panel, wherein the display panel is connected to a data driver configured to output at least one first data signal and at least one second data signal sequentially through an output terminal; and the display panel comprises:

data lines each extending in a first direction, wherein the data lines comprise at least one first data line and at least one second data line, wherein each of the at least one first data line is configured to receive one of the at least one first data signal, and each of the at least one second data line is configured to receive one of the at least one second data signal;

sub-pixels comprising at least one first sub-pixel and at least one second sub-pixel, wherein one of the at least one first sub-pixel is connected to one of the at least one first data line, and one of the at least one second sub-pixel is connected to one of the at least one second data line;

first signal lines each extending along a second direction, wherein the first signal lines cross the first data line and the second data line respectively to form overlapping portions, and the second direction intersects with the first direction;

a gating circuit configured to connect the output terminal of the data driver to the at least one first data line and the at least one second data line through switch units;

a substrate;

a first metal layer disposed on the substrate and comprising the first signal lines;

a second metal layer disposed on the substrate and comprising the at least one first data line and the at least one second data line; and a third metal layer disposed between the first metal layer and the second metal layer, and comprising a shielding layer, the shielding layer comprising a shielding pattern overlapping with at least one of the overlapping portions, wherein the shielding pattern is configured to receive a fixed potential when the output terminal of the data driver provides a data signal to the data lines through the gating circuit.

2. The display panel according to claim 1, further comprising:

at least one first power line each extending along the first direction and each configured to transmit a first power signal, wherein one of the at least one first power line is connected to at least one sub-pixel of the sub-pixels and is located in a layer located between the first metal layer and the second metal layer; and the shielding pattern is coupled with one first power line of the at least one first power line.

3. The display panel according to claim 2, wherein the shielding pattern and the first power line are formed into one piece.

4. The display panel according to claim 3, wherein one of the at least one of the first power lines comprises a first line segment, a second line segment, and a third line segment, wherein, in the first direction, the first line segment and the second line segment are located at two sides of one of the at least one first data line, respectively; and, in the second direction, the first line segment and the second line segment are located at two sides of one of the first signal lines, respectively; and the third line segment is connected between the first line segment and the second line segment and is reused as the shielding pattern, and the third line segment overlaps with one of the overlapping portions that is formed by one of the first signal lines and one of the at least one first data lines.

5. The display panel according to claim 4, wherein each of the sub-pixels comprises a pixel circuit, wherein at least two pixel circuits of the pixel circuits of the sub-pixels are arranged in the first direction to form one pixel circuit column of pixel circuit columns, the at least two pixel circuits comprises a first pixel circuit and a second pixel circuit that are arranged in the pixel circuit column, one first data line of the at least one first data line is connected to the first pixel circuit, and one second data line of the at least one second data line is connected to the second pixel circuit, and the first data line and the second data line are located at two sides of the pixel circuit column, respectively;

one of the at least one first data line and one of the at least one second data line are connected to one of the pixel circuit columns to form one line group of line groups;

the pixel circuit comprises a storage capacitor, wherein the storage capacitor comprises a first electrode plate and a second electrode plate that overlap with each other, wherein the second electrode plate is located at a side of the first electrode plate away from the substrate; and the second line segment and the second electrode plate overlap with each other and are connected to each other through a through hole, and the second line segment is located between the one of the at least one first data line and the one of the at least one second data line that are located in the line group.

6. The display panel according to claim 4, wherein each of the sub-pixels comprises a pixel circuit, wherein at least two pixel circuits of the pixel circuits of the sub-pixels are arranged in the first direction to form one pixel circuit column of pixel circuit columns, the at least two pixel circuits comprises a first pixel circuit and a second pixel circuit that are arranged in the pixel circuit column, one first data line of the at least one first data line is connected to the first pixel circuit, and one second data line of the at least one second data line is connected to the second pixel circuit, and the first data line and the second data line are located at two sides of the pixel circuit column, respectively;

one of the at least one first data line and one of the at least one second data line are connected to one of the pixel circuit columns to form one line group of line groups; and the third line segment comprises a first body and a first extension portion, wherein the first body overlaps with one of the overlapping portions that is formed by one of the at least one first data line and one of the first signal lines, and the first extension portion overlaps with another overlapping portion formed by one of the data lines and the one of the at least one first signal line, wherein the one of the at least one first data line overlapping with the first body and the one of the data line overlapping with the first extension portion belong to two adjacent line groups of the line groups, respectively.

7. The display panel according to claim 3, wherein the first power line comprises a body and an extension portion, wherein the body extends in the first direction, and the extension portion protrudes outwardly from the body in the second direction, is reused as the shielding pattern, and overlaps with at least one of the overlapping portions.

8. The display panel according to claim 7, wherein each of the sub-pixels comprises a pixel circuit, wherein at least two pixel circuits of the pixel circuits of the sub-pixels are arranged in the first direction to form one pixel circuit column of pixel circuit columns, the at least two pixel circuits comprises a first pixel circuit and a second pixel circuit that are arranged in the pixel circuit column, one first data line of the at least one first data line is connected to the first pixel circuit, and one second data line of the at least one second data line is connected to the second pixel circuit, and the first data line and the second data line are located at two sides of the pixel circuit column, respectively;

one of the at least one first data line and one of the at least one second data line are connected to one of the pixel circuit columns to form one line group of line groups;

the body is located between two adjacent data lines of the data lines, and two of the data lines that are respectively located at two sides of the body belong to two adjacent line groups of the line groups, respectively; and the extension portion comprises a second extension portion overlapping with one of the overlapping portions that is formed by one of the at least one first data line and one of the first signal lines; and/or, the extension portion comprises a third extension portion overlapping with one of the overlapping portions that is formed by one of the at least one second data line and one of the first signal lines.

9. The display panel according to claim 8, wherein the at least one first signal line comprises a first signal sub-line and a second signal sub-line that are adjacent to each other in the first direction, wherein the at least one first data line and the at least one second data line cross the first signal sub-line and the second signal sub-line respectively to form the overlapping portions; and the second extension portion comprises a first extension sub-portion and a second extension sub-portion, wherein the first extension sub-portion overlaps with one of the overlapping portions that is formed by the one of the at least one first data line and the first signal sub-line, the second extension sub-portion overlaps with another one of the overlapping portions that is formed by the one of the at least one first data line and the second signal sub-line, and the first power line further comprises a first connection portion connected between the first extension sub-portion and the second extension sub-portion; and/or, the third extension portion comprises a third extension sub-portion and a fourth extension sub-portion, wherein the third extension sub-portion overlaps with the overlapping portion formed by the one of the at least one second data line and the first signal sub-line, the fourth extension sub-portion overlaps with the overlapping portion formed by the one of the at least one second data line and the second signal sub-line, and the first power line further comprises a second connection portion connected between the third extension sub-portion and the fourth extension sub-portion.

10. The display panel according to claim 3, wherein the first power line comprises a body in a strip shape;

the body at least partially overlaps with one first data line of the at least one first data line, the first data line comprises a first protruding portion, the body and the first protruding portion do not overlap with each other, and the first protruding portion is connected to the first sub-pixel through a first through hole;

and/or, the body at least partially overlaps with the second data line, the second data line comprises a second protruding portion, the body and the second protruding portion do not overlap, and the second protruding portion is connected to one of the at least one second sub-pixel through a second through hole.

11. The display panel according to claim 2, wherein one of the sub-pixel further comprises a pixel circuit comprising a storage capacitor, wherein the storage capacitor comprises a first electrode plate and a second electrode plate that overlap with each other, wherein the second electrode plate is located at a side of the first electrode plate away from the substrate, one of the at least one first power line and the second electrode plate overlap with each other and are connected to each other through a through hole, and the shielding pattern and the second electrode plate are located in a same layer.

12. The display panel according to claim 11, wherein the shielding pattern and the second electrode plate are formed into one piece.

13. The display panel according to claim 2, wherein the at least one first power line is located at a side of the third metal layer away from the substrate; and the shielding pattern is connected to one of the at least one first power line through a through hole.

14. The display panel according to claim 1, further comprising:

a common electrode configured to transmit a second power signal, wherein each of the sub-pixels comprises a first electrode, a light-emitting layer, and a second electrode that are stacked, and the second electrodes of the sub-pixels are connected to each other to form the common electrode; and the shielding pattern is coupled with the common electrode.

15. The display panel according to claim 14, further comprising:

an adapter electrode, wherein the switching electrode is located in a layer located between the third metal layer and the common electrode; and the shielding pattern is coupled with the common electrode through the adapter electrode.

16. The display panel according to claim 1, wherein each of the sub-pixels further comprise a pixel circuit, at least two pixel circuits of the pixel circuits are arranged in the first direction to form a pixel circuit column, the at least two pixel circuits comprise first pixel circuits and second pixel circuits that are arranged alternately in the first direction, one of the at least one first data line is connected to one of the first pixel circuits, and one of the at least one second data line is connected to one of the second pixel circuits; and at least one first data line comprises a plurality of first data lines, at least one second data line comprises a plurality of second data lines, at least one first data signal comprises a plurality of first data signals, at least one second data signal comprises a plurality of second data signals, the output terminal are connected to n first data lines of the plurality of first data lines and n second data lines of the plurality of second data lines, where n is an integer, and $n \leq 2$; and the data driver is configured to sequentially output n first data signals of the plurality of first data signals and n second data signals of the plurality of second data signals through the output terminal.

17. A display apparatus, comprising a display panel, wherein the display panel is connected to a data driver configured to output at least one first data signal and at least one second data signal sequentially through an output terminal; and the display panel comprises:

data lines each extending in a first direction, wherein the data lines comprise at least one first data line and at least one second data line, wherein each of the at least one first data line is supplied with one of the at least one first data signal, and each of the at least one second data line is supplied with one of the at least one second data signal;

sub-pixels comprising at least one first sub-pixel and at least one second sub-pixel, wherein one of the at least one first sub-pixel is connected to one of the at least one first data line, and one of the at least one second sub-pixel is connected to one of the at least one second data line;

first signal lines each extending along a second direction, wherein one of the first signal lines crosses one of the at least one first data line to form a first overlapping portion, and crosses one of the at least one second data line to form a second overlapping portion, the second direction intersecting the first direction;

a gating circuit configured to connect the output terminal of the data driver to the at least one first data line and the at least one second data line through switch units;

a substrate;

a first metal layer disposed on the substrate and comprising the first signal lines;

a second metal layer disposed on the substrate and comprising the at least one first data line and the at least one second data line; and a third metal layer disposed between the first metal layer and the second metal layer, and comprising a shielding layer, wherein the shielding layer comprises a shielding pattern that overlapping with at least one of the first overlapping portion or the second overlapping portion, wherein the shielding pattern is supplied with a fixed potential when the output terminal of the data driver provides a data signal to the data lines through the gating circuit.

* * * * *